(12) United States Patent
Lee et al.

(10) Patent No.: US 8,664,634 B2
(45) Date of Patent: Mar. 4, 2014

(54) PROTRUDING POST RESISTIVE MEMORY DEVICES

(75) Inventors: Hyun-Ju Lee, Seoul (KR); Jae-Kyu Lee, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/599,259

(22) Filed: Aug. 30, 2012

(65) Prior Publication Data

US 2013/0140516 A1   Jun. 6, 2013

(30) Foreign Application Priority Data

Dec. 6, 2011   (KR) .................. 10-2011-0129377

(51) Int. Cl.
*H01L 27/105* (2006.01)
*H01L 29/12* (2006.01)

(52) U.S. Cl.
USPC ...................................... 257/5; 257/E45.002

(58) Field of Classification Search
None
See application file for complete search history.

(56) References Cited

U.S. PATENT DOCUMENTS

| 6,107,650 | A | 8/2000 | Takahashi et al. | |
|---|---|---|---|---|
| 7,586,149 | B2 * | 9/2009 | Yoon et al. | ..... 257/329 |
| 7,816,720 | B1 | 10/2010 | Hsieh | |
| 7,829,941 | B2 | 11/2010 | Hu et al. | |
| 7,928,505 | B2 | 4/2011 | Hirao et al. | |
| 8,039,298 | B2 * | 10/2011 | An et al. | ..... 438/102 |
| 2002/0027237 | A1 | 3/2002 | Onishi et al. | |
| 2005/0167748 | A1 | 8/2005 | Onda et al. | |
| 2006/0113588 | A1 | 6/2006 | Wu | |
| 2007/0170498 | A1 | 7/2007 | Hu et al. | |
| 2009/0140327 | A1 | 6/2009 | Hirao et al. | |
| 2009/0161413 | A1 | 6/2009 | Yoon et al. | |
| 2010/0019314 | A1 | 1/2010 | Kachi | |
| 2010/0155838 | A1 | 6/2010 | Jung | |
| 2010/0208516 | A1 | 8/2010 | Javerliac et al. | |
| 2010/0295120 | A1 * | 11/2010 | Sandhu et al. | ..... 257/329 |
| 2011/0017971 | A1 * | 1/2011 | Kim et al. | ..... 257/5 |
| 2011/0068409 | A1 | 3/2011 | Kim et al. | |
| 2011/0089487 | A1 | 4/2011 | Nakata et al. | |
| 2011/0095350 | A1 * | 4/2011 | Yoon et al. | ..... 257/306 |
| 2011/0215396 | A1 * | 9/2011 | Tang et al. | ..... 257/329 |

FOREIGN PATENT DOCUMENTS

| JP | 2008-34660 | 2/2008 |
|---|---|---|
| KR | 10-2011-0018510 A | 2/2011 |
| KR | 10-1049589 B1 | 7/2011 |

* cited by examiner

*Primary Examiner* — Thomas L Dickey
*Assistant Examiner* — Joseph Schoenholtz
(74) *Attorney, Agent, or Firm* — Myers Bigel Sibley & Sajovec, P.A.

(57) ABSTRACT

A resistive memory device may include a substrate, gate electrode structures, a first impurity region, a second impurity region, a first metal silicide pattern and a second metal silicide pattern. The substrate may have a first region where isolation patterns and first active patterns may be alternately arranged in a first direction, and a second region where linear second active patterns may be extended in the first direction. The gate electrode structures may be arranged between the first region and the second region of the substrate. The first and second impurity regions may be formed in the first and second impurity regions. The first metal silicide pattern may have an isolated shape configured to make contact with an upper surface of the first impurity region. The second metal silicide pattern may make contact with an upper surface of the second impurity region.

15 Claims, 25 Drawing Sheets

PROTRUDING POST RESISTIVE MEMORY DEVICES

CROSS REFERENCE TO RELATED APPLICATION

This application claims priority under 35 USC §119 to Korean Patent Application No. 10-2011-0129377, filed on Dec. 6, 2011 in the Korean Intellectual Property Office (KIPO), the contents of which are herein incorporated by reference in their entirety.

BACKGROUND

1. Field

Example embodiments relate to semiconductor devices such as semiconductor memory devices and methods of manufacturing the same. More particularly, example embodiments relate to resistive memory devices, and methods of manufacturing the resistive memory devices.

2. Description of the Related Art

Generally, a unit cell of a resistive memory device may include one transistor and one variable resistive element. Further, a bit line may be connected to one end of the unit cell. A source line for applying a bias may be connected to another end of the unit cell.

In order to form the resistive memory device, active patterns and isolation trenches for isolating the active patterns from each other may be formed on a semiconductor substrate. As the resistive memory device may have been highly integrated, a width of the isolation trench may be narrowed. Further, a width of the source line may also be reduced.

SUMMARY

Example embodiments provide highly integrated resistive memory devices that can have a stable structure and improved operational characteristics.

Example embodiments also provide methods of manufacturing the above-mentioned resistive memory devices.

According to some example embodiments, there is provided a resistive memory device. The resistive memory device may include a substrate, gate electrode structures, a first impurity region, a second impurity region, a first metal silicide pattern, a second metal silicide pattern, a bit line contact, a resistive structure and a bit line. The substrate may have a first region where isolation patterns and first active patterns may be alternately arranged in a first direction, and a second region where linear second active patterns may be extended in the first direction. The gate electrode structures may be arranged between the first region and the second region of the substrate. The gate electrode structures may have a linear shape extended in the first direction. The first and second impurity regions may be in the first and second active patterns at both sides of each of the gate electrode structures, respectively. The first metal silicide pattern may have an isolated shape configured to contact an upper surface of the first impurity region. The second metal silicide pattern may contact an upper surface of the second impurity region. The second metal silicide pattern may be extended in the first direction. The bit line contact may be on the first metal silicide pattern. The resistive structure may be connected to the bit line contact. The bit line may be connected to the resistive structure.

In example embodiments, the substrate may have recesses. The gate electrode structures may be formed in the recesses.

In example embodiments, the gate electrode structures may be three in number between the second active patterns. The three gate electrode structures may have a linear shape extended in the first direction.

In example embodiments, gate electrode structures among the gate electrode structures adjacent to the second active patterns may serve as a gate electrode of a cell selection transistor. A central gate electrode structure among the gate electrode structures may serve as a gate electrode of an isolated transistor.

In example embodiments, the second metal silicide pattern may correspond to a source line connected to a source region of a transistor.

In example embodiments, the resistive memory device may further include a conductive pattern on the second metal silicide pattern.

In example embodiments, the second metal silicide pattern may have a thickness substantially the same as that of the first metal silicide pattern.

In example embodiments, the second impurity region may have a lower surface lower than that of the first impurity region.

In example embodiments, the second metal silicide pattern may have a thickness greater than that of the first metal silicide pattern.

According to some example embodiments, there is provided a method of manufacturing a resistive memory device. In the method of manufacturing the resistive memory device, the substrate may be etched to form isolation trenches, first preliminary active patterns and second active patterns. The first preliminary active patterns may be extended in a second direction. The second active patterns may be extended in a first direction substantially perpendicular to the second direction to support the first preliminary active patterns. Isolation patterns may be formed in the isolation trenches. The first preliminary active patterns and the isolation patterns may be etched to form first active patterns having an isolated shape and recesses extended in the first direction. Gate electrode structures may be formed in the recesses. First and second impurity regions may be formed in the first and second impurity regions at both sides of each of the gate electrode structures, respectively. A first metal silicide pattern may be formed on an upper surface of the first impurity region. A second metal silicide pattern may be formed on an upper surface of the second impurity region. A bit line contact may be formed on the first metal silicide pattern. A resistive structure may be connected to the bit line contact. A bit line may be connected to the resistive structure.

In example embodiments, forming the first and second metal silicide patterns may include forming a metal layer on the substrate on, and in some embodiments to cover, the first and second impurity regions, and reacting a metal in the metal layer with silicon in the first and second impurity regions.

In example embodiments, forming the second impurity region and forming the second metal silicide pattern may include forming a first blocking pattern on the substrate to expose the second active patterns, doping the second active patterns with impurities to form the second impurity region, forming a metal layer on the substrate on, and in some embodiments to cover, the first blocking pattern and the second impurity region, and reacting a metal in the metal layer with silicon in the second impurity region to form the second metal silicide pattern.

In example embodiments, forming the first impurity region and forming the first metal silicide pattern may include forming a second blocking pattern on the substrate to expose the first active patterns, doping the first active patterns with impurities to form the first impurity region, forming a metal layer on the substrate on, and in some embodiments to cover, the second blocking pattern and the first impurity region, and reacting a metal in the metal layer with silicon in the first impurity region to form the first metal silicide pattern.

In example embodiments, the method may further include forming an etch mask pattern for forming the isolation trenches.

According to other example embodiments, a semiconductor device comprises a semiconductor substrate including an array of semiconductor posts protruding therefrom. A respective post includes a pair of first opposing semiconductor sidewalls and a pair of second opposing semiconductor sidewalls. The pair of first opposing semiconductor sidewalls is longer than the pair of second opposing semiconductor sidewalls.

In some example embodiments, an isolation pattern extends between the first opposing semiconductor sidewalls of adjacent ones of the array of semiconductor posts. Moreover, in some example embodiments, an electrode pattern extends between the second opposing semiconductor sidewalls of adjacent ones of the array of semiconductor posts. In some example embodiments, the electrode comprises an insulating layer on the second opposing semiconductor sidewalls of adjacent ones of the array of semiconductor posts and a gate electrode on the insulating layer.

In some example embodiments, an array of memory cells is also provided, a respective one of which is on, and electrically connected to, a respective one of the semiconductor posts. The array of memory cells may comprise an array of resistive memory cells.

According to example embodiments, the active patterns where the source line may be formed may have the linear shape, so that the active patterns may be supported by each other. Thus, the active pattern may not lean toward an adjacent active pattern. Further, the source line may make contact with the active patterns, so that the source line may have a low resistance. Therefore, the resistive memory device may have improved operational characteristics and low noise in the source line.

BRIEF DESCRIPTION OF THE DRAWINGS

Example embodiments will be more clearly understood from the following detailed description taken in conjunction with the accompanying drawings. FIGS. 1 to 16 represent non-limiting, example embodiments as described herein.

FIG. 2 is a plan view illustrating the resistive memory device in FIG. 1;

FIG. 3 is a cross-sectional view illustrating the resistive memory device in FIG. 1;

FIG. 6 is a perspective view illustrating a resistive memory device in accordance with example embodiments;

FIG. 7 is a cross-sectional view illustrating the resistive memory device in FIG. 6;

FIG. 9 is a perspective view illustrating a resistive memory device in accordance with example embodiments;

FIG. 10 is a cross-sectional view illustrating the resistive memory device in FIG. 9;

FIG. 12 is a perspective view illustrating a resistive memory device in accordance with example embodiments;

FIG. 13 is a perspective view illustrating a resistive memory device in accordance with example embodiments;

FIG. 14 is a cross-sectional view illustrating the resistive memory device in FIG. 13;

FIG. 16 is a block diagram illustrating an electronic system including any one of the resistive memory devices in accordance with example embodiments.

DETAILED DESCRIPTION OF THE EMBODIMENTS

Figure 1A:
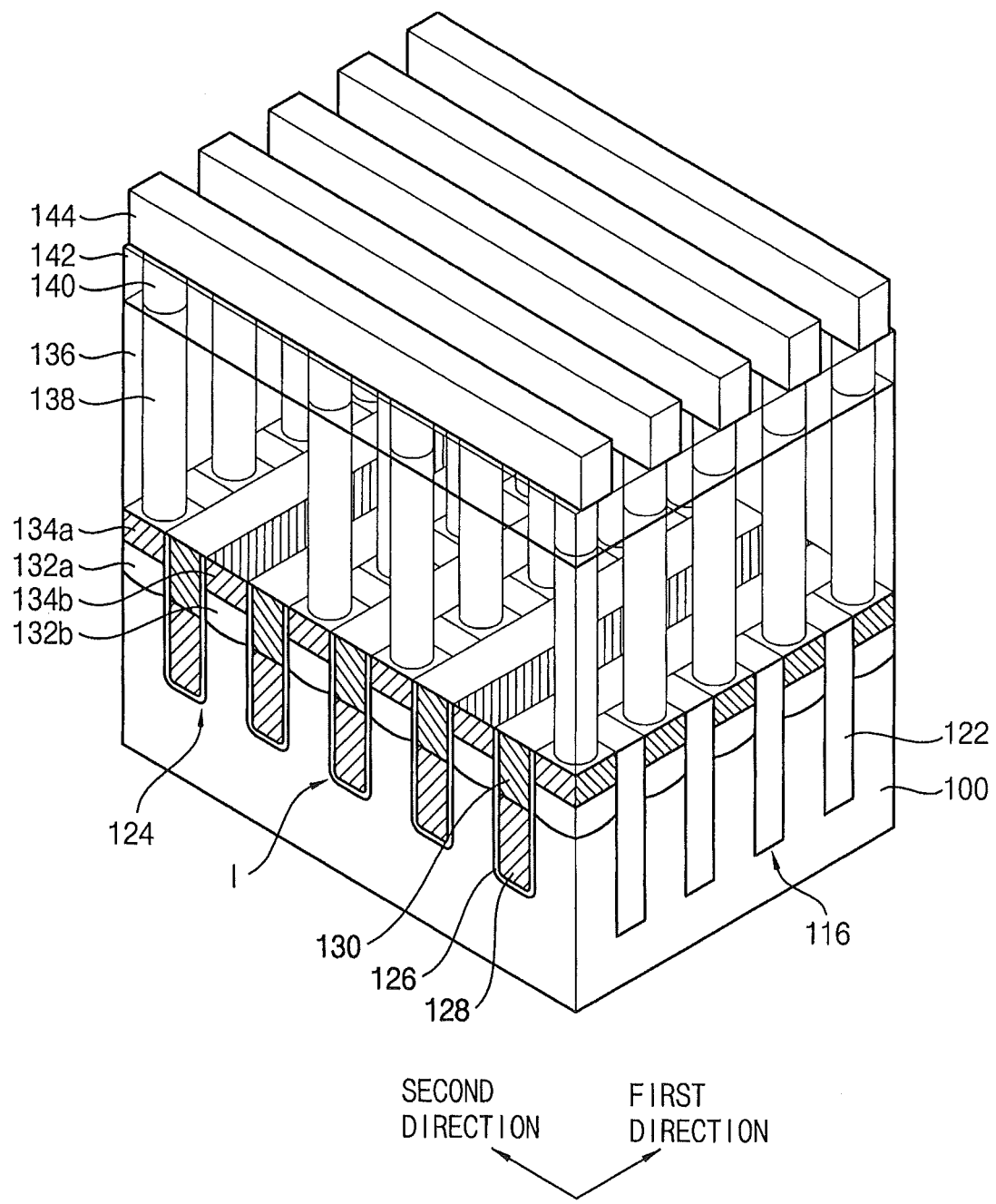
FIGS. 1A and 1B, which may be collectively referred to herein as FIG. 1, are perspective views illustrating a resistive memory device in accordance with example embodiments.

Various example embodiments will be described more fully hereinafter with reference to the accompanying drawings, in which some example embodiments are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Figure 2:
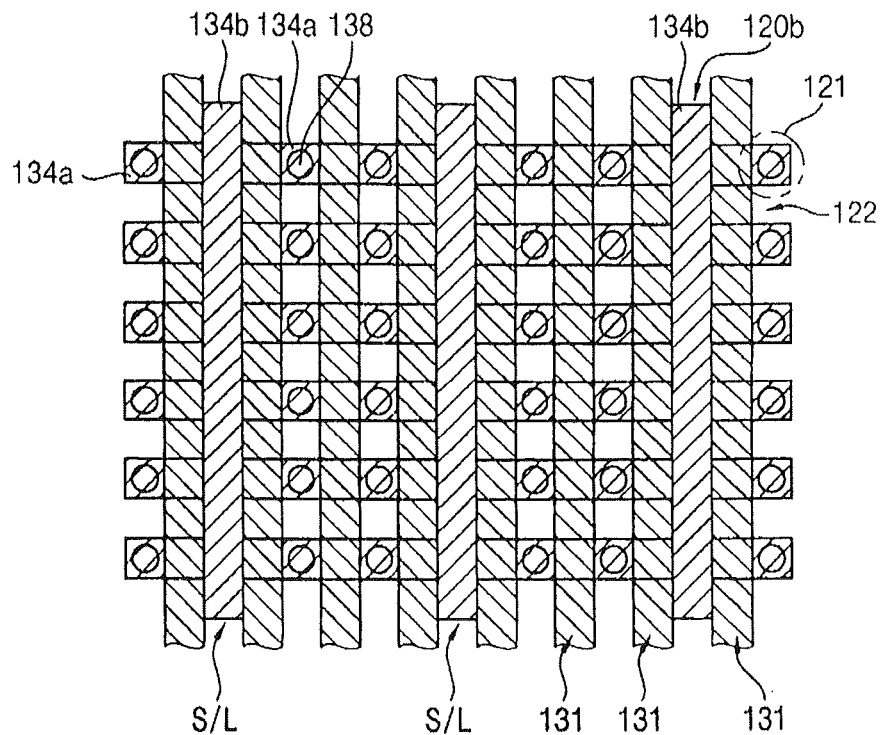
Figure 3:
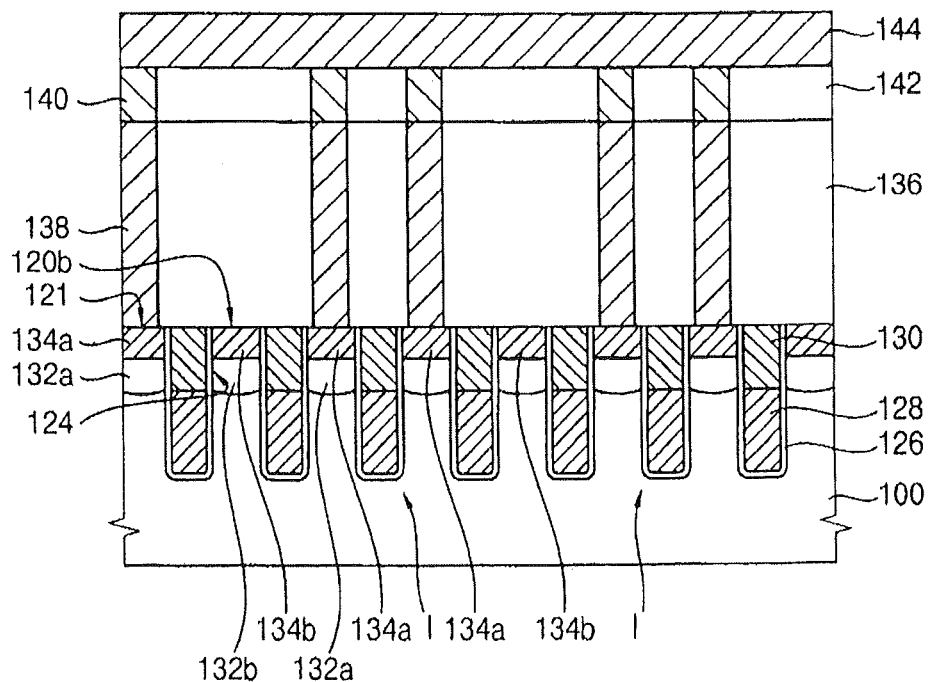

FIG. 1A is a perspective view illustrating a resistive memory device in accordance with example embodiments, FIG. 2 is a plan view illustrating the resistive memory device in FIG. 1A, and FIG. 3 is a cross-sectional view illustrating the resistive memory device in FIG. 1A.

Referring to FIGS. 1A to 3, a single element and/or compound semiconductor substrate 100 may have isolation trenches 116 and recesses 124. In example embodiments, the trenches 116 may be filled with isolation patterns 122. A gate electrode may be formed in each of the recesses 124.

In example embodiments, the isolation trenches 116 may be positioned in a region of the semiconductor substrate 100 corresponding to a field region. The recesses 124 may be positioned in a region of the semiconductor substrate 100 where the gate electrodes may be formed. Thus, regions of the semiconductor substrate 100 where the isolation trenches 116 and the recesses 124 may not exist may have protruded shapes protruded from the regions of the semiconductor substrate 100 where the isolation trenches 116 and the recesses 124 may be formed. Hereinafter, the protruded shapes of the regions in the semiconductor substrate 100 may be referred to as an active pattern. The active pattern may include a first active pattern 121 having an isolated shape, and a second active pattern 120b having a linear shape.

In example embodiments, the recesses 124 may have a linear shape extended in a first direction. The linear recesses 124 may be arranged spaced apart from each other by a uniform gap in a second direction substantially perpendicular to the first direction.

A gate structure of a buried transistor may be formed in each of the recesses 124. In example embodiments, the gate structure may include a gate insulating layer 126, a gate electrode 128 and a mask pattern 130. The gate insulating layer 126 may be formed on an inner surface of the recess 124. The gate electrode 128 may be formed on the gate insulating layer 126. The recess 124 may be partially filled with the gate electrode 128. The mask pattern 130 may be formed on the gate electrode 128 to fill up the recess 124.

In example embodiments, a first linear region and a second linear region may be defined between the recesses 124. The first active patterns 121 and the isolation patterns 122 may be positioned in the first linear region. Only the second active patterns 120b may be arranged in the second linear region.

In example embodiments, the first active patterns 121 in the first linear region may serve as pads connected to bit lines so as to form each of unit cells. Thus, each of the active patterns 121 may have the isolated shape.

In example embodiments, the isolation patterns 122 in the first linear region may be arranged between the first active patterns 121 to electrically isolate the first active patterns 121 from each other. As mentioned above, the isolation patterns 122 may be formed in the isolation trenches 116.

In example embodiments, the isolation trenches 116 may have a depth deeper than that of the recesses 124. Therefore, the isolation patterns 122 may have a bottom surface lower than that of the gate electrode 128.

In example embodiments, the second active pattern 120b in the second linear region may serve as a source line. Thus, the second active pattern 120b may have a linear shape extended in the first direction. That is, the second active pattern 120b and the gate electrode 128 may be extended in the first direction. Here, the isolation patterns 122 may not exist in the second linear region. Thus, the second active pattern 120b may not have a portion cut by the isolation patterns 122.

In example embodiments, the two isolated first active patterns 121 may be arranged between the second linear regions. The three buried transistors may be arranged between the second linear regions. The second active pattern 120b in the second linear region may serve as a common source region of the buried transistors adjacent to both sidewalls of the second active pattern 120b.

In example embodiments, two edge-located buried transistors among the three buried transistors in the second linear region may serve as selection transistors for selecting cells. Thus, it may be required to electrically isolate the edge-located buried transistors from each other. That is, a central buried transistor may not serve as the selection transistor. The central buried transistor may serve as an isolated transistor I for electrically isolating the two edge-located buried transistors.

As a result, a gate electrode between the first linear regions may serve as a gate electrode of the isolated transistor I. Further, the isolated transistor I may always be maintained in a turn-off state.

Alternatively, an isolation pattern in place of the gate electrode may be formed at a region where the isolated transistor I may be formed. In this case, the two selection transistors may be electrically isolated from each other by the isolation pattern.

The first active pattern 121 and the second active pattern 120b may be formed at both sides of the gate electrode 128. A first impurity region 132a and a second impurity region 132b serving as a source region and a drain region may be formed in upper portions of the first active pattern 121 and the second active pattern 120b. That is, the first impurity region 132a may be formed in the first active pattern 121. The second impurity region 132b may be formed in the second active region 120b. In example embodiments, the first impurity region 132a and the second impurity region 1 132b may have substantially the same depth. A channel length of the buried transistor may be determined by controlling the depths of the first impurity region 132a and the second impurity region 132b.

A first metal silicide pattern 134a may be provided on the first active pattern 121. A second metal silicide pattern 134b may be provided on the second active pattern 120b.

In example embodiments, the first metal silicide pattern 134a may have an isolated shape. The first metal silicide pattern 134a may function as a pad making contact with a bit line contact plug. The first metal silicide pattern 134a may have a lower surface making contact with the first impurity region 132a.

In example embodiments, the second metal silicide pattern 134b may have a linear shape extended in the first direction. The second metal silicide pattern 134b may serve as a source line S/L to which a bias may be applied. The second metal silicide pattern 134b may have a lower surface making contact with the second impurity region 132b.

Because the second active pattern 120b may have the linear shape extended in the first direction, leaning of the first active pattern 121 may be reduced. Further, because the source line may directly make contact with the second active pattern 120b, the source line may have a reduced resistance and a stable voltage.

An insulating interlayer 136 may cover the first metal silicide pattern 134a, the second metal silicide pattern 134b and the gate electrodes 128. In example embodiments, the insulating interlayer 136 may include a single layer or a multi-layer.

A contact plug 138 may be formed through the insulating interlayer 136. The contact plug 138 may make contact with the first metal silicide pattern 134a.

A resistive structure 140 may be formed on the contact plug 138. In example embodiments, kinds of the resistive structure 140 may vary in accordance with kinds of the resistive memory devices. For example, when the resistive memory device may include a PRAM, the resistive structure 140 may include a GST material. When the resistive memory device may include an MRAM, the resistive structure 140 may include an MTJ structure. When the resistive memory device may include a RRAM, the resistive structure 140 may include a TMO.

An upper insulating interlayer 142 may be formed between the resistive structures 140. A bit line 144 may electrically make contact with the resistive structures 140. The bit line 144 may directly make contact with the resistive structure 140. Alternatively, the bit line 144 may be connected to the resistive structure 140 via a bit line contact.

Figure 1B:
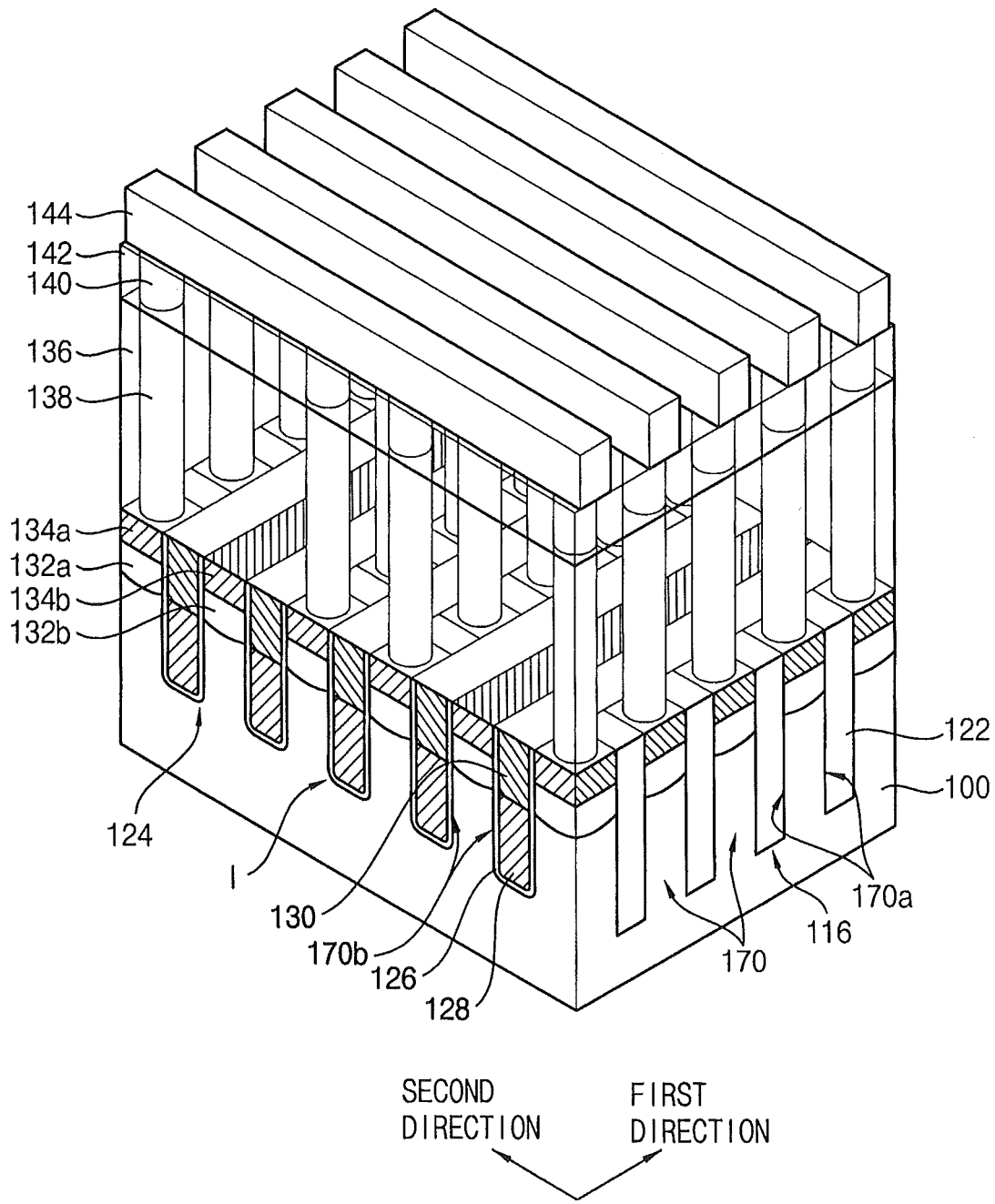

As shown in FIG. 1B, various example embodiments described herein may be regarded as providing a semiconductor device that comprises a semiconductor substrate 100 including an array of semiconductor posts 170 protruding therefrom. A respective post 170 includes a pair of first opposing semiconductor sidewalls 170a and a pair of second opposing semiconductor sidewalls 170b. As illustrated in FIG. 1B, the pair of first opposing semiconductor sidewalls 170a is longer than the pair of second opposing semiconductor sidewalls 170b. Moreover, an isolation pattern 122 may extend between the first opposing semiconductor sidewalls 170a of adjacent ones of the array of semiconductor posts 170. An electrode pattern, that may comprise an insulating layer 126 on the second opposing semiconductor sidewalls 170b of adjacent ones of the array of semiconductor posts 170 and a gate electrode 128 on the insulating layer 126, extends between the second opposing semiconductor sidewalls 170b of adjacent ones of the array of semiconductor posts 170. An array of memory cells, such as resistive memory cells 140, may also be provided, a respective one of which is on, and electrically connected to, a respective one of the semiconductor posts 170.

FIGS. 4A to 4G are plan views illustrating a method of manufacturing the resistive memory device in FIG. 1, and FIGS. 5A to 5M are cross-sectional views and perspective views illustrating a method of manufacturing the resistive memory device in FIG. 1.

Figure 4A:
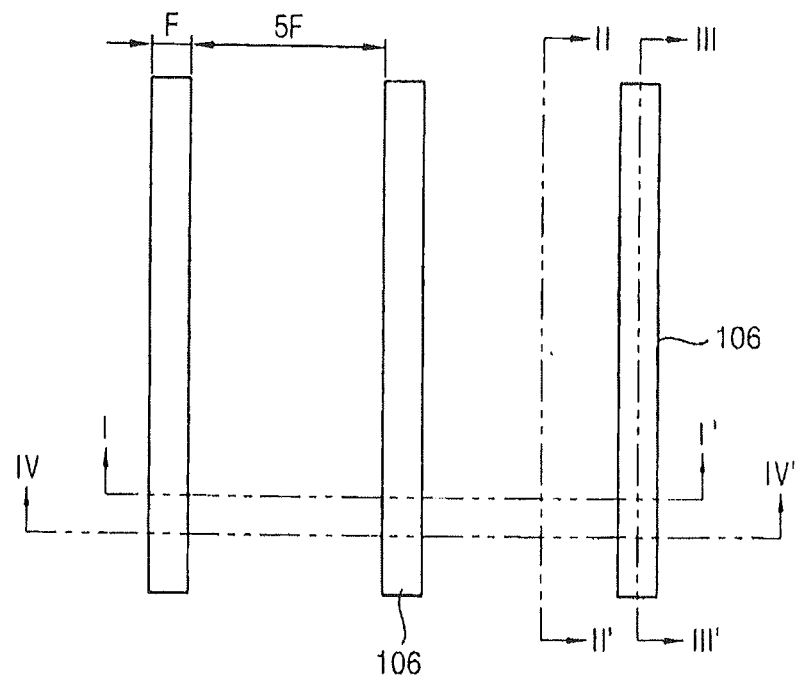
FIGS. 4A to 4G are plan views illustrating a method of manufacturing the resistive memory device in FIG. 1.

FIGS. 5A to 5H are cross-sectional views taken along lines I-I', II-II' and III-III' in FIG. 4A, and FIGS. 5J to 5M are cross-sectional views taken along a line IV-IV' in FIG. 4A.

Figure 5A:
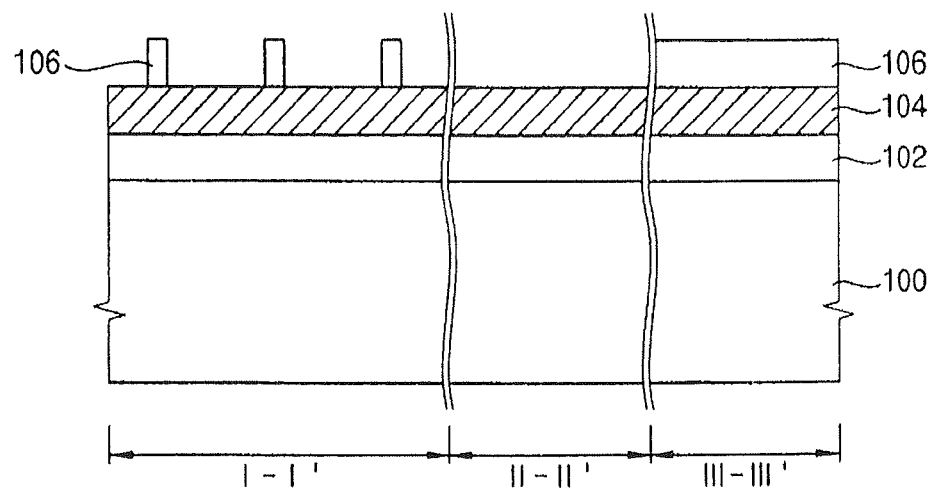
FIGS. 5A to 5M are cross-sectional views and perspective views illustrating a method of manufacturing the resistive memory device in FIG. 1.

Referring to FIGS. 4A and 5A, a first mask layer 102 and a second mask layer 104 may be sequentially stacked on an upper surface of a semiconductor substrate 100. In example embodiments, the first mask layer 102 may include a silicon oxide layer. The second mask layer 104 may include a polysilicon layer.

A third mask pattern 106 may be formed on the second mask layer 104. In example embodiments, the third mask pattern 106 may have a linear shape extended in a first direction. The third mask pattern 106 may be used as a mask for forming a second active pattern by following processes. Thus, the third mask pattern 106 may be positioned over a region where the second active pattern may be formed.

In example embodiments, isolation trenches and recesses may have a first width F. In this case, the third mask patterns 106 may have the first width F. A gap 5F between the third mask patterns 106 may be about 5 times of the first width F.

Although not depicted in drawings, in order to form the third mask patterns 106, provisional patterns having a width of about 5 times the first width F may be formed. Spacers may be formed on sidewalls of the provisional patterns. The provisional patterns may then be removed. The spacers may remain unchanged. The spacers may be used as the third mask patterns 106.

Figure 5B:
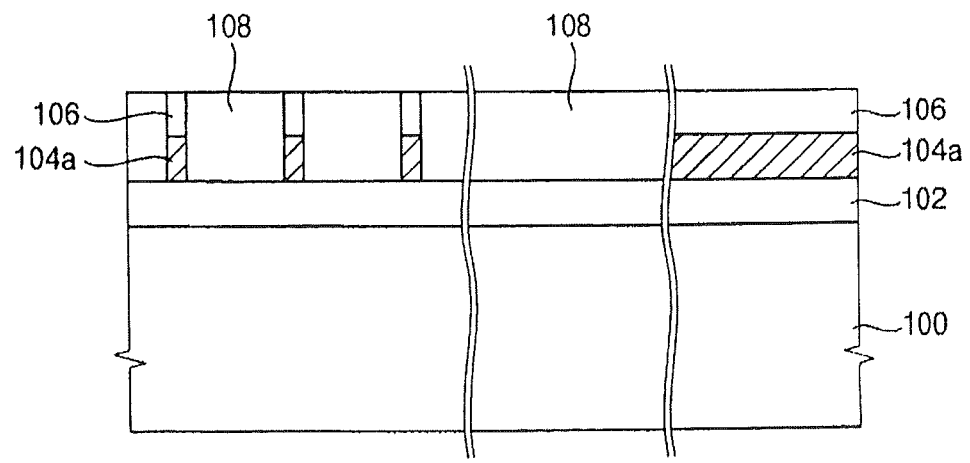

Referring to FIG. 5B, the second mask layer 104 may be etched using the third mask patterns 106 as an etch mask to form a second mask pattern 104a. The third mask pattern 106 may be stacked on the second mask pattern 104a.

A buried insulating layer 108 may be formed on an upper surface of the first mask layer 102 to cover the second mask pattern 104a and the third mask pattern 106. The buried insulating layer 108 may then be planarized.

Figure 4B:
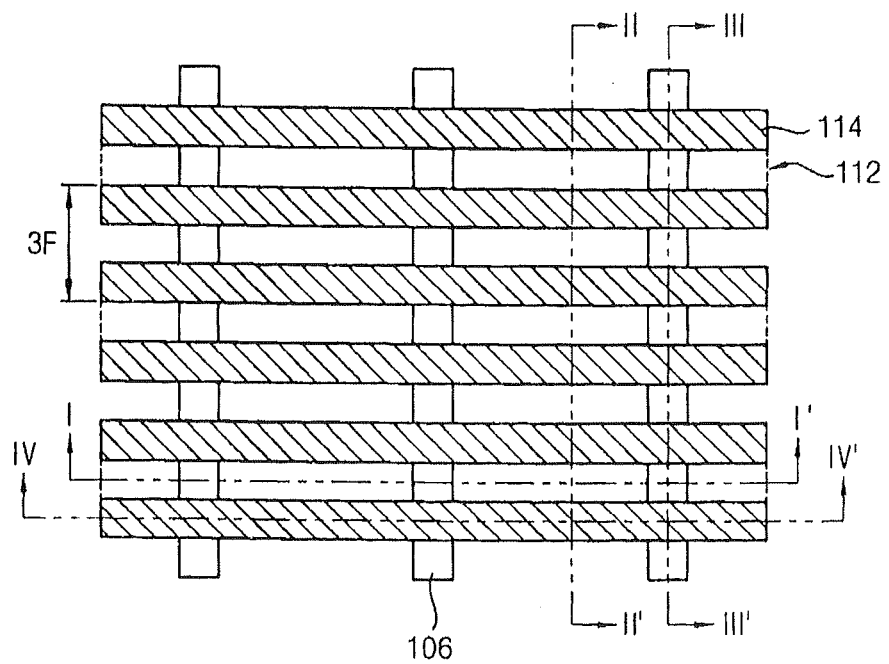
Figure 5C:
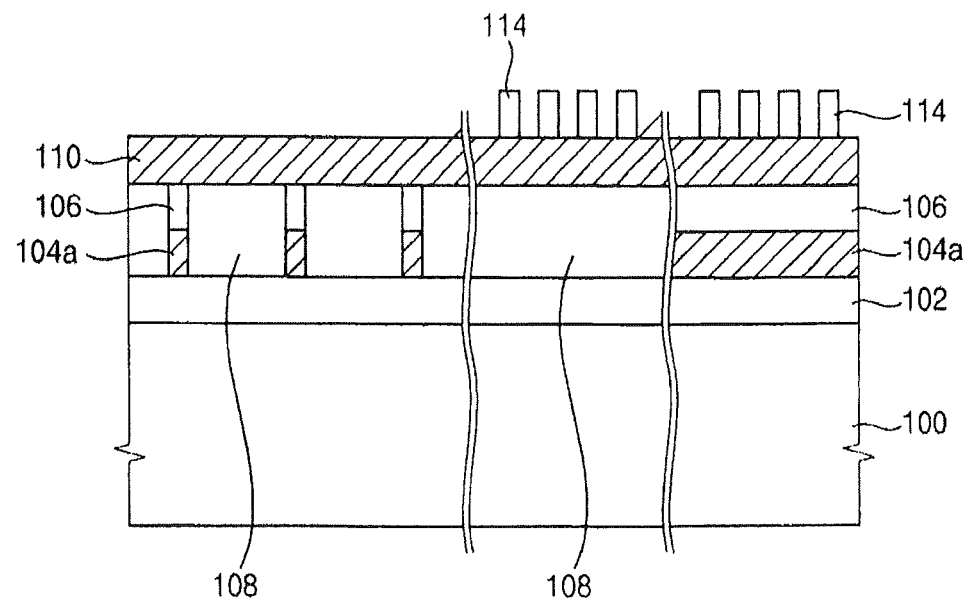
Figure 5D:
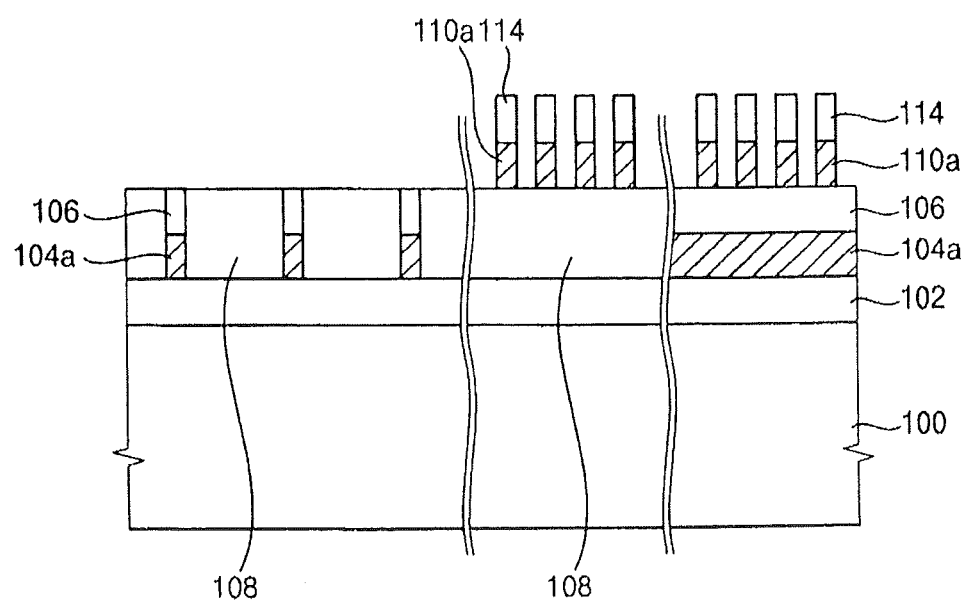

Referring to FIGS. 4B and 5C, a fourth mask layer 110 may be formed on an upper surface of the buried insulating layer 108. In example embodiments, the fourth mask layer 110 may include a polysilicon layer.

Fifth mask patterns 114 may be formed on an upper surface of the fourth mask layer 110. In example embodiments, the fifth mask patterns 114 may have a linear shape extended in the second direction. The fifth mask patterns 114 may have the first width F. A gap between the fifth mask patterns 114 may be the first width F.

Although not depicted in drawings, in order to form the fifth mask patterns 114, provisional patterns having the first width F may be formed. The provisional patterns may be spaced apart from each other by an interval of about 3 times the first width F. Spacers may be formed on sidewalls of the provisional patterns. The provisional patterns may then be removed. The spacers may remain unchanged. The spacers may be used as the fifth mask patterns 114.

The fourth mask layer 110 may be etched using the fifth mask patterns 114 as an etch mask to form a fourth mask pattern 110a.

By the etching process, the buried insulating layer 108 and the third mask pattern 106 including the silicon oxide may be exposed. The second mask pattern 104a including the polysilicon may be positioned under the third mask pattern 106.

Figure 4C:
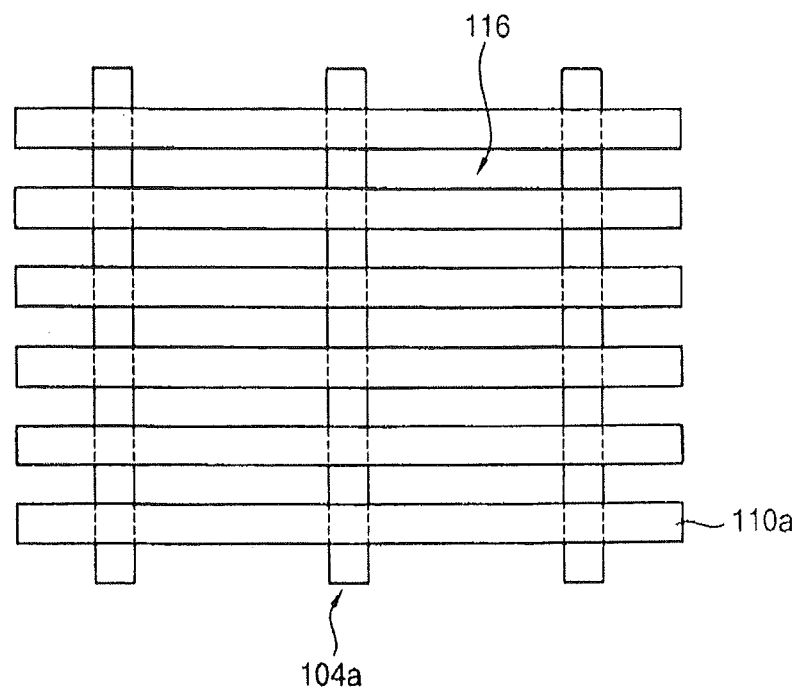
Figure 5E:
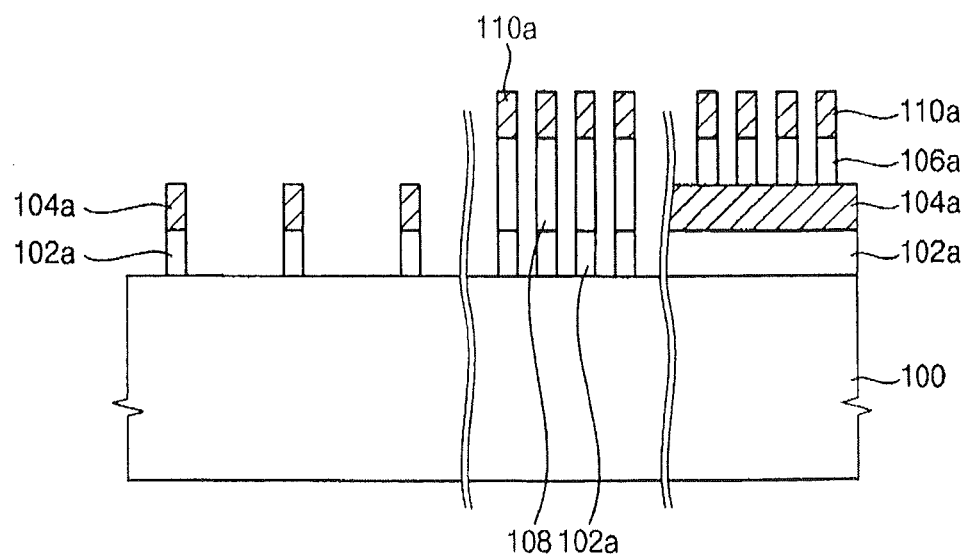

Referring to FIGS. 4C and 5E, the buried insulating layer 108, the third mask pattern 106 and the fifth mask pattern 114 including the silicon oxide may be anisotropically etched to expose the second mask pattern 104a and the fourth mask pattern 110a including the polysilicon. Further, upper surfaces of the semiconductor substrate 100 where the second mask pattern 104a or the fourth mask pattern 110a may not exist may also be exposed.

Therefore, in I-I' region, the second mask pattern 104a may remain in regions where active regions may be formed. Upper surfaces of the semiconductor substrate 100 in I-I' region may be exposed. In II-II' region, the fourth mask pattern 110a may remain in regions where the active regions may be formed. Upper surfaces of the semiconductor substrate 100 in II-II' region may be exposed. In contrast, because III-III' region may correspond to the active region, the second mask pattern 104a and the fourth mask pattern 110a may remain. Upper surfaces of the semiconductor substrate 100 in III-III' region may not be exposed.

Figure 5F:
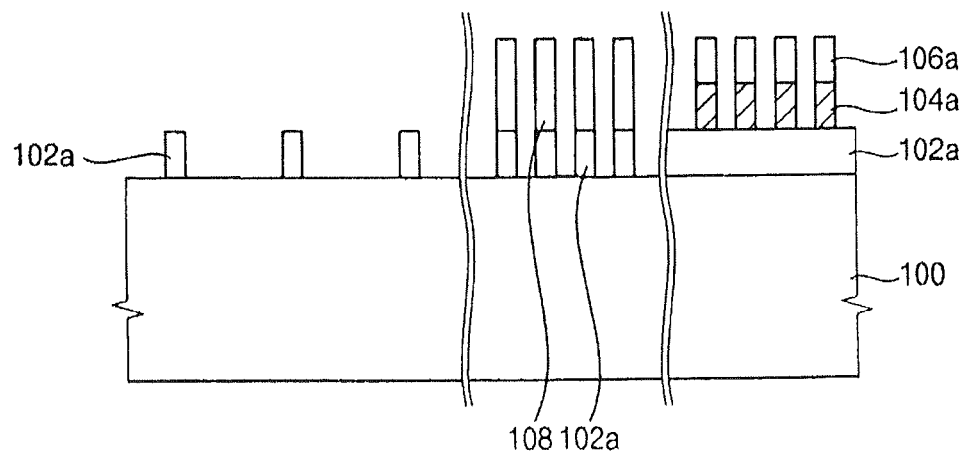

Referring to FIG. 5F, the second mask pattern 104a and the fourth mask pattern 110a may be removed by an anisotropic etching process, an isotropic etching process, etc.

By the etching process, mask patterns may remain in regions corresponding to the active regions. That is, the first mask pattern 102a may remain in a region 120a in FIG. 4D corresponding to a first preliminary active pattern. The second mask pattern 104a, the third mask pattern 106a and the buried insulating layer 108 may partially remain on the first mask pattern 102 in a region 120b in FIG. 4D corresponding to a second active pattern.

Although not depicted in drawings, when the second mask pattern 104a and the fourth mask pattern 110a may be removed by the isotropic etching process, the layers on the first mask pattern 102 in III-III' region may be entirely removed.

Figure 4D:
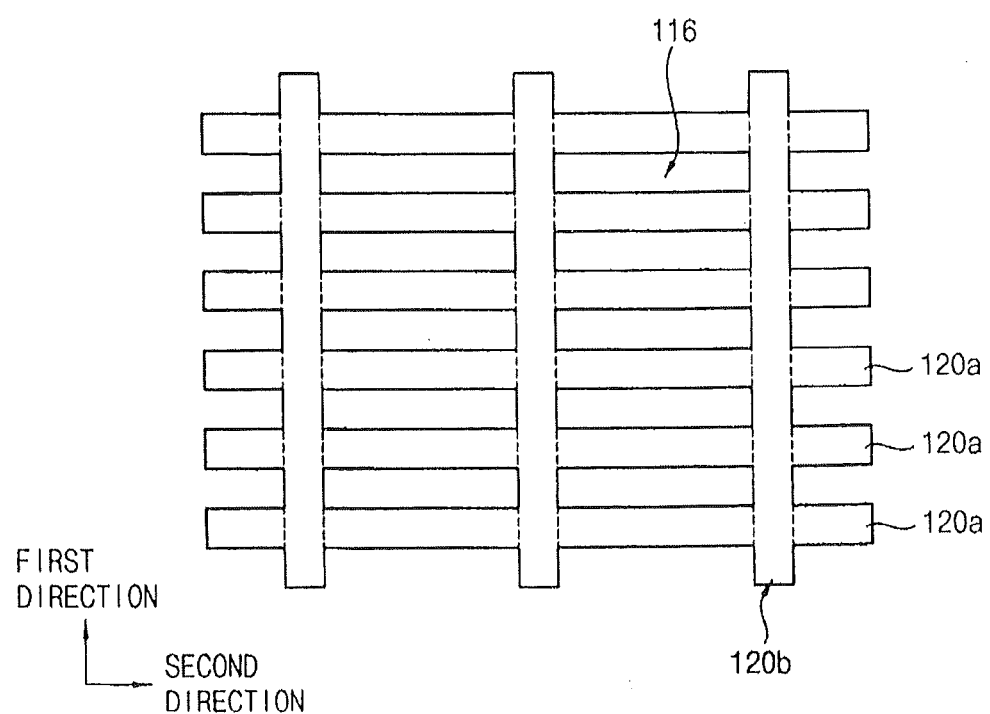
Figure 5G:
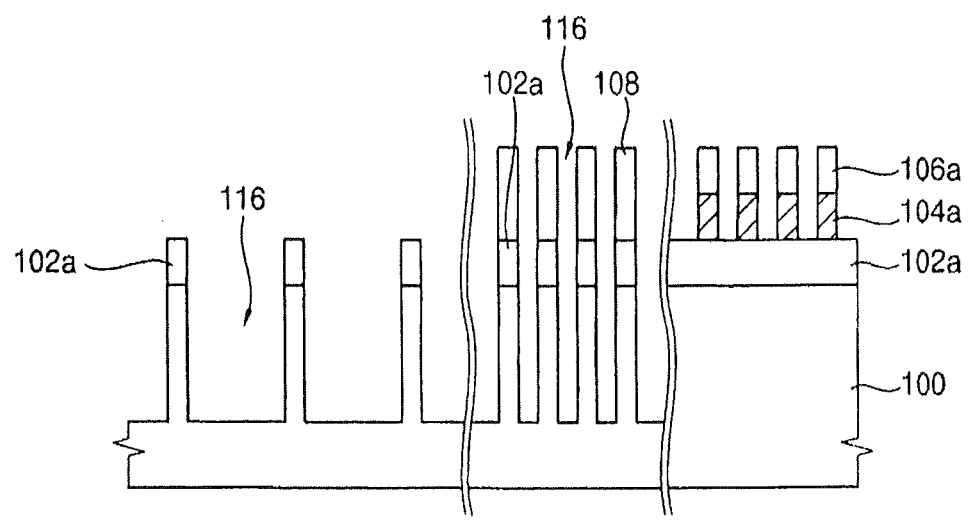

Referring to FIGS. 4D and 5G, the semiconductor substrate 100 may be etched using the first mask pattern 102a as an etch mask to form isolation trenches 116. In example embodiments, the isolation trenches 116 may have a deep depth for electrically isolating the active patterns from each other. For example, the depth of the isolation trenches 116 may be no less than about 5,000 Å.

In example embodiments, by forming the isolation trenches 116, the first preliminary active patterns 120a and the second active patterns 120b may have linear shapes extended in the second direction. Portions of the first preliminary active patterns 120a and the second active patterns 120b in a region where a source line may be formed may be extended in the first direction. Thus, the first preliminary active patterns 120a and the second active patterns 120b may be intersected with each other in the region, so that the first preliminary active patterns 120a and the second active patterns 120b may be supported by each other.

The first preliminary active patterns 120a and the isolation regions may be alternately arranged in II-II' region of FIG. 5G. Thus, the first preliminary active patterns 120a and the isolation trenches 116 may be alternately arranged.

Because the isolation trenches 116 may have the deep depth, the first preliminary active patterns 120a may have a high aspect ratio. Thus, the first preliminary active patterns 120a may lean toward each other, so that the leaning first preliminary active patterns 120a may make contact with each other. However, as shown in FIG. 4D, the second active patterns 120b may support the first preliminary active patterns 120a, so that the first preliminary active patterns 120a may not lean.

Figure 5H:
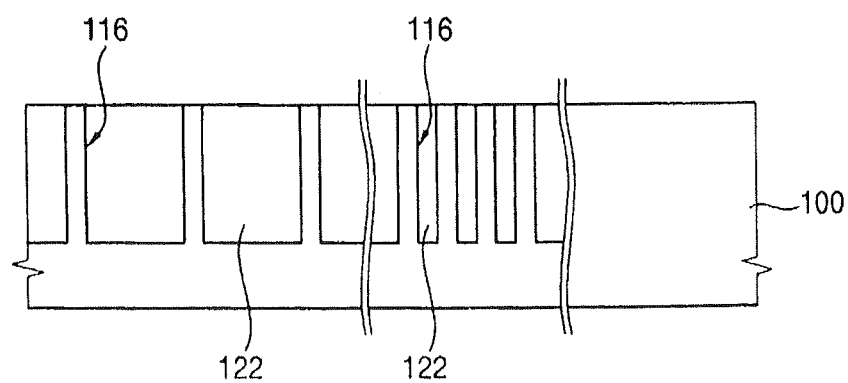
Figure 5I:
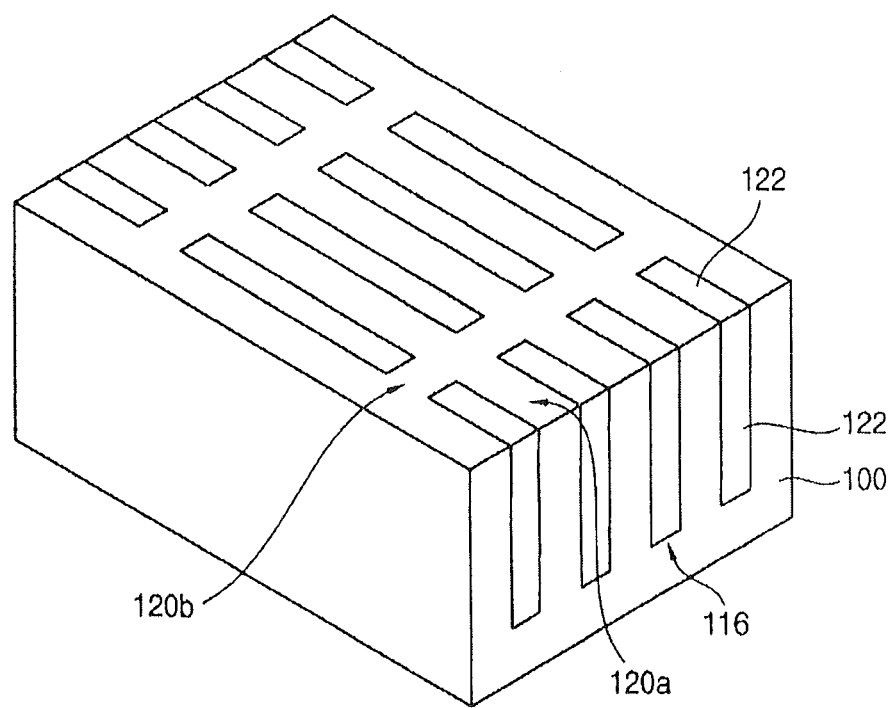

Referring to FIGS. 5H and 5I, an isolation layer may be formed in the isolation trenches 116. In example embodiments, the isolation layer may include silicon oxide. The isolation layer may be planarized to form an isolation pattern 122. The isolation pattern 122 may define an active region and a field region of the semiconductor substrate 100. The active region may have a shape protruded from a bottom surface of the semiconductor substrate 100. The field region may include the isolation pattern 122 in the isolation trenches 116.

Figure 5J:
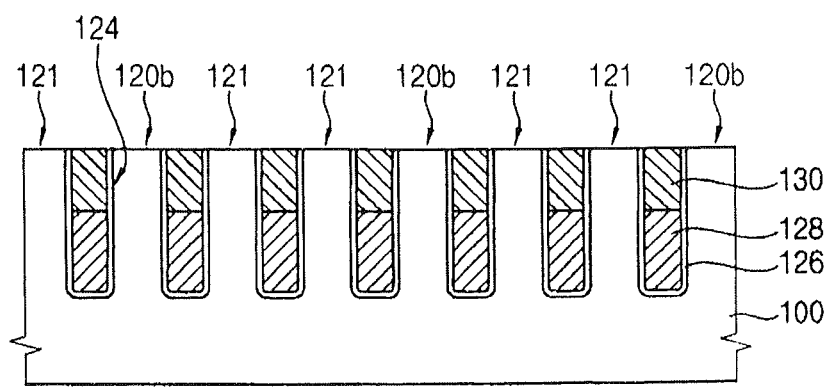

FIG. 5J is a cross-sectional view illustrating a gate electrode structure in the recess 124 by cutting the substrate along the first direction.

Figure 4E:
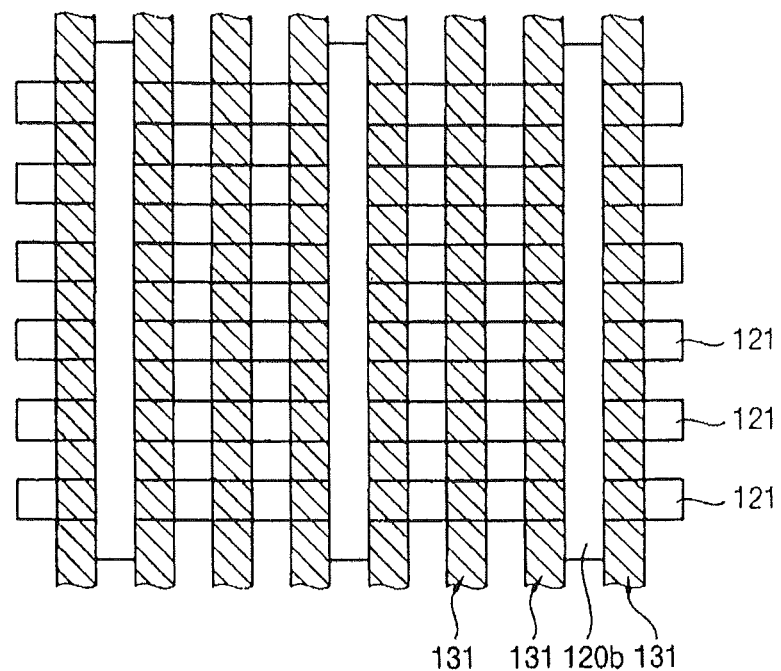

Referring to FIGS. 4E and 5J, an etch mask pattern (not shown) may be formed on the semiconductor substrate 100. In example embodiments, the etch mask pattern may have a linear shape extended in the first direction.

The active region and the field region of the semiconductor substrate 100 may be etched using the etch mask pattern to form recesses 124 in regions where gate electrodes may be formed. In example embodiments, the recesses 124 may be formed by partially etching the first preliminary active pattern 120a and the field region. Thus, by forming the recesses 124, first active patterns 121 having isolated shapes may be formed.

Gate electrode structure 131 may be formed in the recesses 124. In example embodiments, a gate insulating layer 126 may be formed on an inner surface of the recess 124. A gate electrode 128 may be formed on the gate insulating layer 126. The recess 124 may be partially filled with the gate electrode 128. For example, the gate electrode 128 may be formed by forming a gate electrode layer in the recess 124, and by etching the gate electrode layer. A mask pattern 130 may be formed on the gate electrode 128 to fill up the recess 124.

The layers on the first active pattern 121 and the second active pattern 120b may then be removed to expose the upper surfaces of the first active pattern 121 and the second active pattern 120b.

Figure 5K:
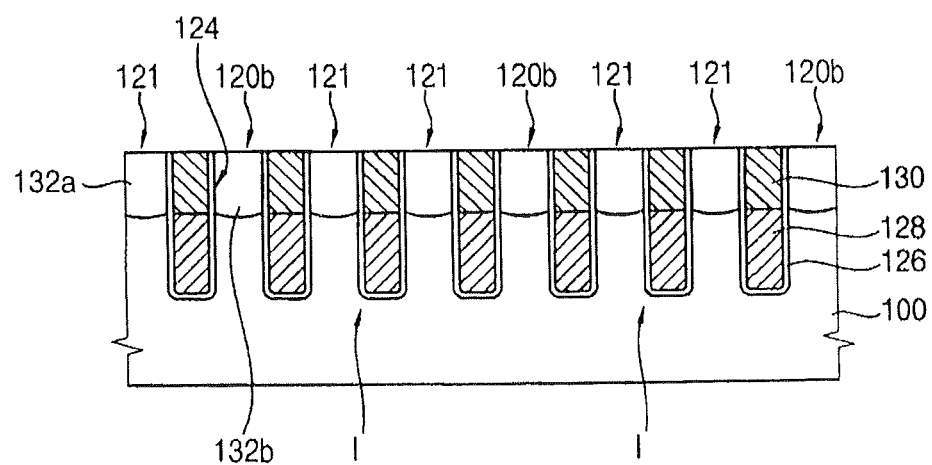
Figure 5L:
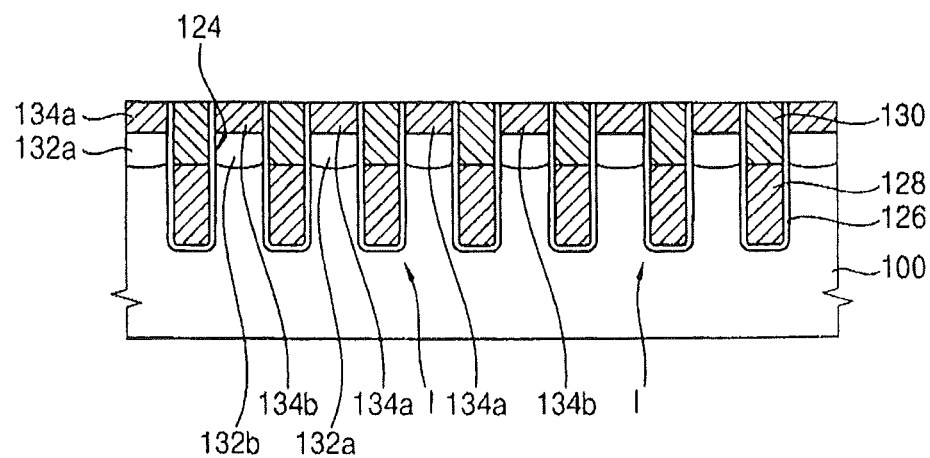

Referring to FIG. 5K, impurities may be implanted into the first active pattern 121 and the second active pattern 120b to form a first impurity region 132a under the first active pattern 121 and a second impurity region 132b under the second active pattern 120b. The first impurity region 132a and the second impurity region 132b may serve as a source region and a drain region of the buried transistor. In example embodiments, the first impurity region 132a and the second impurity region 132b may be formed by one doping process, so that the first impurity region 132a and the second impurity region 132b may have substantially the same depth.

The buried transistors for selecting a cell may be formed by the above-mentioned processes. As mentioned above, any one of the buried transistors may be used as the isolation transistor I, not the cell selection transistor.

Figure 4F:
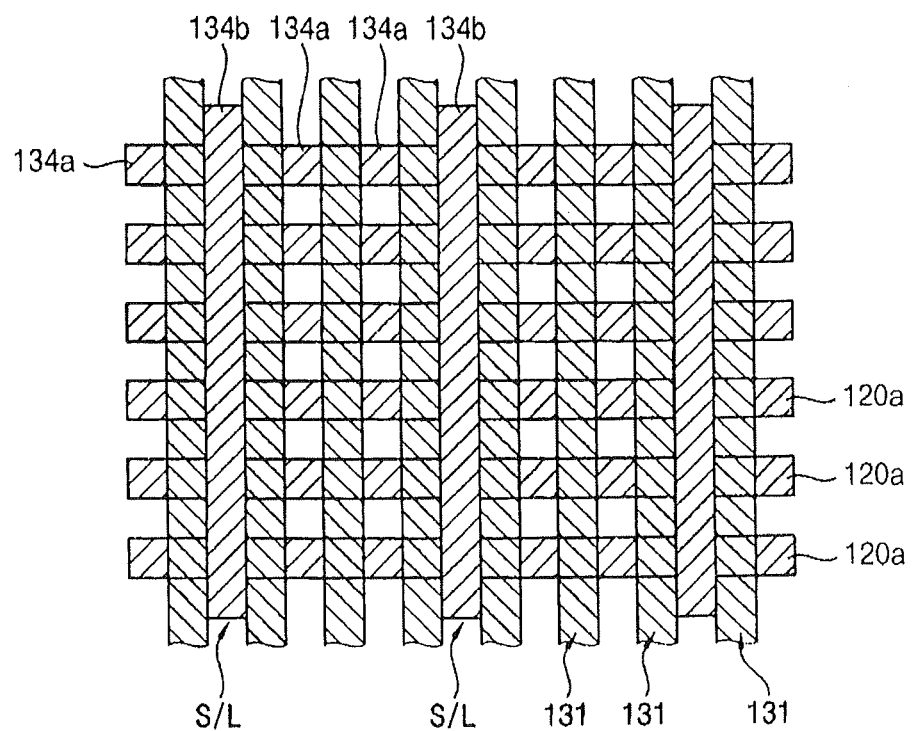

Referring to FIGS. 4F and 5I, a metal layer (not shown) may make contact with the upper surfaces of the first active pattern 121 and the second active pattern 120b.

Silicon in the first active pattern 121 and the second active pattern 120b may be reacted with metal in the metal layer to form a first metal silicide pattern 134a in the first active pattern 121 and a second metal silicide layer pattern 134b in the second active pattern 120b. In example embodiments, the first metal silicide pattern 134a and the second metal silicide pattern 134b may include nickel silicide, cobalt silicide, tungsten silicide, tantalum silicide, titanium silicide, etc.

In example embodiments, the first metal silicide pattern 134a may make contact with the first impurity region 132a. The first metal silicide pattern 134a may have an isolated shape. The second metal silicide pattern 134b may make contact with the second impurity region 132b. The second metal silicide pattern 134b may have a linear shape extended in the first direction. The second metal silicide pattern 134b may serve as a source line S/L connected between the source regions of each of the cell selection transistors.

In example embodiments, the second active pattern 120b may have the linear shape. The second metal silicide pattern 134b making contact with the second active pattern 120b may serve as the source line S/L. Thus, the source line S/L may have a low resistance. Therefore, a voltage may be stably applied to the source line S/L to reduce failures such as source line noises. Further, the source line S/L may be formed without an additional patterning process.

Figure 4G:
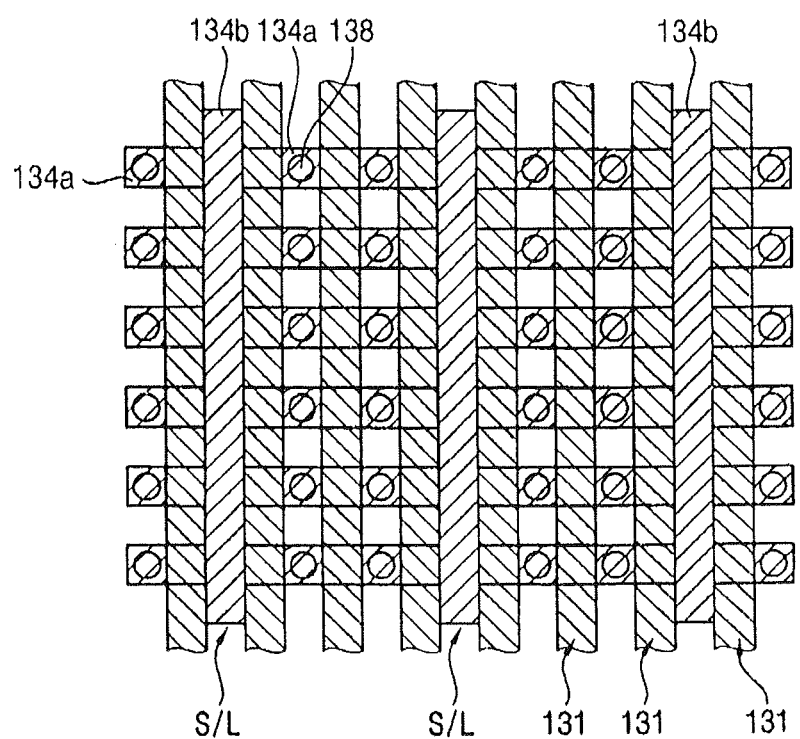
Figure 5M:
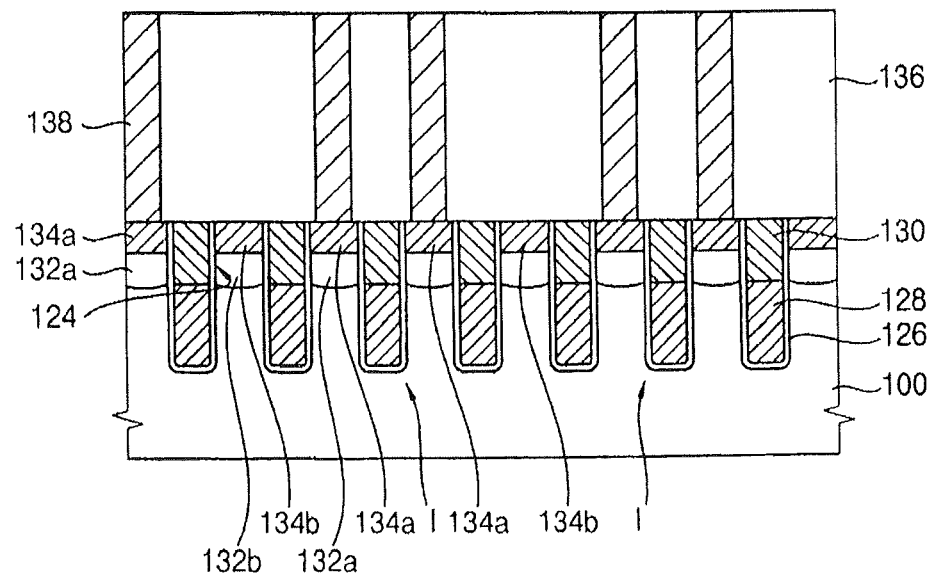

Referring to FIGS. 4G and 5M, an insulating interlayer 136 may be formed on the semiconductor substrate 100 to cover the first metal silicide pattern 134a, the second metal silicide pattern 134b and the gate electrode structure 131. The insulating interlayer 136 may have a single layer or a multi-layer.

Contact holes may be formed through the insulating interlayer 136 to expose the upper surface of the first metal silicide pattern 134a. The contact holes may be filled with a conductive material to form a contact plug 138 making contact with the first metal silicide pattern 134a.

Referring to FIGS. 1 and 3, a resistive structure 140 may be formed on the contact plug 138. In example embodiments, kinds of the resistive structure 140 may vary in accordance with kinds of the resistive memory devices. For example, when the resistive memory device may include a PRAM, the resistive structure 140 may include a GST material. When the resistive memory device may include an MRAM, the resistive structure 140 may include an MTJ structure. When the resistive memory device may include a RRAM, the resistive structure 140 may include a TMO.

An upper insulating interlayer 142 may be formed between the resistive structures 140. A bit line 144 may be formed on the upper insulating interlayer 142 to complete the resistive memory device in FIGS. 1 and 3. The bit line 144 may electrically make contact with the resistive structures 140.

According to this example embodiment, the active pattern of the resistive memory device manufactured by the above-mentioned processes may not lean. Further, the source line of the resistive memory device may have a low resistance.

Figure 6:
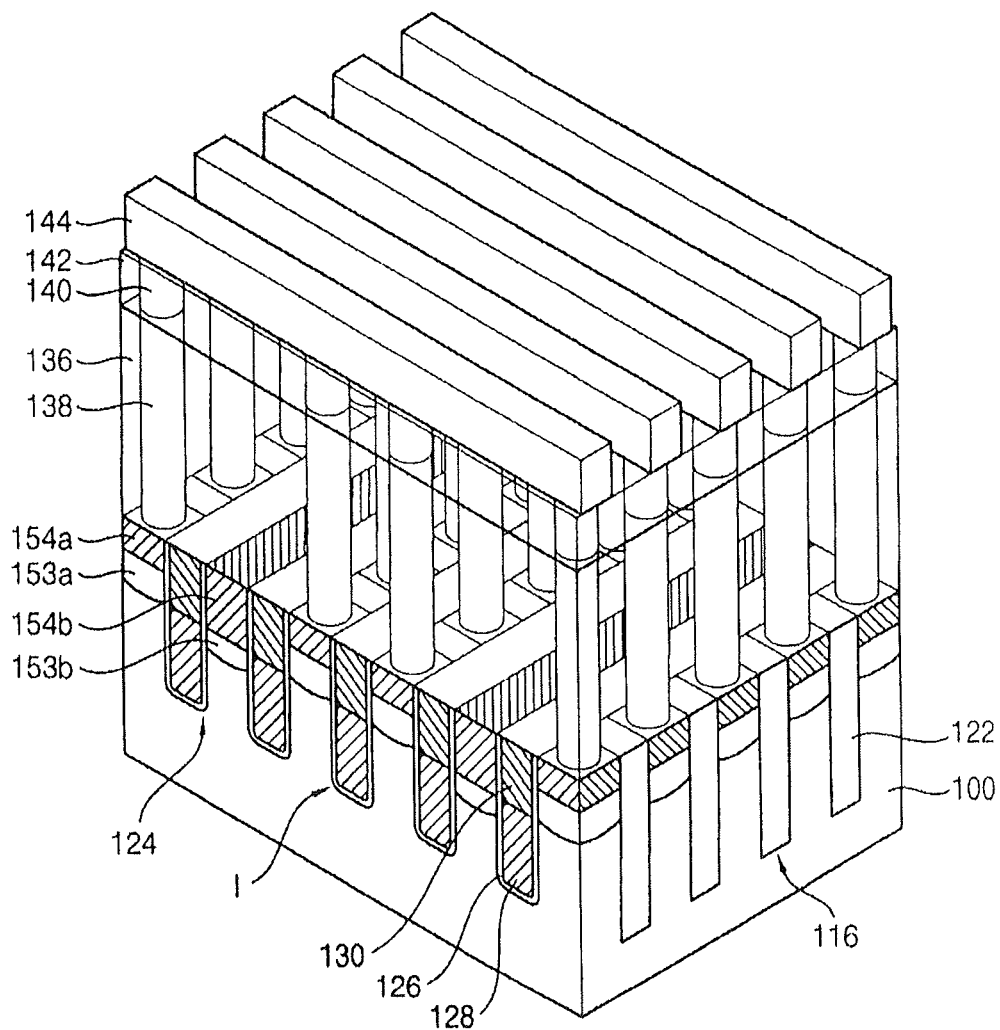
Figure 7:
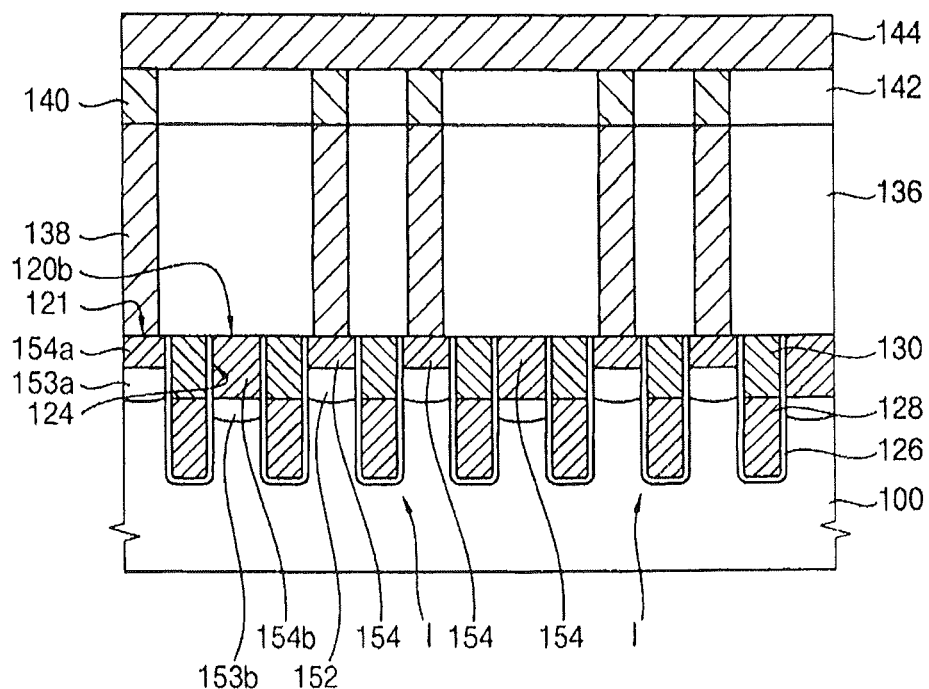

FIG. 6 is a perspective view illustrating a resistive memory device in accordance with example embodiments, and FIG. 7 is a cross-sectional view illustrating the resistive memory device in FIG. 6.

The resistive memory device in FIGS. 6 and 7 may include elements substantially the same as those of the resistive memory device in FIG. 1 except for a metal silicide pattern as a source line and an impurity region of a buried transistor. Thus, the same reference numerals may refer to the same elements and any further illustrations with respect to the same elements may be omitted herein for brevity.

Referring to FIGS. 6 and 7, the semiconductor substrate 100 may have the isolation trenches 116 and the recesses 124. The trenches 116 and the recesses 124 may have shapes substantially the same as those of the trenches 116 and the recesses in FIG. 1, respectively. Thus, the active pattern protruded from the semiconductor substrate 100 may have the isolated first active pattern 121 and the linear second active pattern 120b.

The gate electrode structures of the buried transistor may be formed in the recesses 124. The gate electrode structure may have a linear shape extended in the first direction. The gate electrode structure may have a structure substantially the same as that of the gate electrode structure in FIGS. 1 to 3.

In example embodiments, a first linear region and a second linear region may be defined between the recesses 124. The first active patterns 121 and the isolation patterns 122 may be positioned in the first linear region. Only the second active patterns 120b may be arranged in the second linear region. The isolation patterns 122 may be formed in the isolation trenches 116.

The first active pattern 121 and the second active pattern 120b may be formed at both sides of the gate electrode 128. A first impurity region 153a and a second impurity region 153b serving as a source region and a drain region may be formed in upper portions of the first active pattern 121 and the second active pattern 120b. That is, the first impurity region 153a may be formed in the first active pattern 121. The second impurity region 153b may be formed in the second active region 120b.

In example embodiments, the second impurity region 153b may have a depth deeper than that of the first impurity region 153a. That is, the second impurity region 153b may have a lower surface lower than that of the first impurity region 153a. In contrast, the second impurity region 153b may have an upper surface lower than that of the first impurity region 153a. Therefore, according to this example embodiment, the first impurity region 153a and the second impurity region 153b serving as the source region and the drain region of the buried transistor may be asymmetrically arranged.

A channel length of the buried transistor may be determined by positioning the lower surface of the first impurity region 153a. Further, because the lower surface of the second impurity region 153b may be located at a sufficient low plane, a thick metal silicide pattern may be formed on the upper surface of the second impurity region 153b. As a result, the source line may have a low resistance.

A first metal silicide pattern 154a may be provided on the first active pattern 121. A second metal silicide pattern 154b may be provided on the second active pattern 120b. In example embodiments, the second metal silicide pattern 154b may have a second thickness greater than a first thickness of the first metal silicide pattern 153a.

In example embodiments, the first metal silicide pattern 154a may have an isolated shape. The first metal silicide pattern 154a may function as a pad making contact with a bit line contact plug. The first metal silicide pattern 154a may have a lower surface making contact with the first impurity region 153a.

In example embodiments, the second metal silicide pattern 154b may have a linear shape extended in the first direction. The second metal silicide pattern 154b may serve as a source line S/L to which a bias may be applied. The second metal silicide pattern 154b may have a lower surface making contact with the second impurity region 153b. The lower surface of the second metal silicide pattern 154b may be positioned lower than the lower surface of the first metal silicide pattern 154a.

As mentioned above, the resistance of the source line may be reduced by providing the second metal silicide pattern 154b with the thick thickness.

An insulating interlayer 136 may be formed on the upper surface of the semiconductor substrate 100 to cover the first metal silicide pattern 154a, the second metal silicide pattern 154b and the gate electrodes 128. A contact plug 138 may be formed through the insulating interlayer 136. The contact plug 138 may make contact with the first metal silicide pattern 154a.

A resistive structure 140 may be formed on the contact plug 138. An upper insulating interlayer 142 may be formed between the resistive structures 140. A bit line 144 may electrically make contact with the resistive structures 140. The bit line 144 may directly make contact with the resistive structure 140.

FIGS. 8A to 8D are cross-sectional views illustrating a method of manufacturing the resistive memory device in FIGS. 6 and 7.

Processes substantially the same as those illustrated with reference to FIGS. 5A to 5J may be performed to form a gate electrode structure of a buried transistor on the semiconductor substrate 100 having the active region and the field region.

Figure 8A:
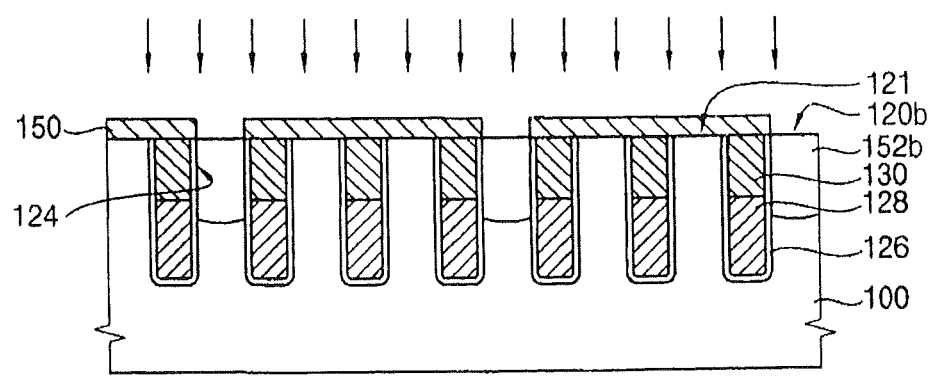
FIGS. 8A to 8D are cross-sectional views illustrating a method of manufacturing the resistive memory device in FIGS. 6 and 7.

Referring to FIG. 8A, a first etch stop layer (not shown) may be formed on the upper surface of the semiconductor substrate 100. A first silicide blocking layer (not shown) may be formed on the first etch stop layer. In example embodiments, the first etch stop layer may include silicon oxide. The first silicide blocking layer may include silicon nitride.

The first silicide blocking layer may be etched until the first etch stop layer may be exposed to form a first silicide blocking layer pattern 150. Exposed portions of the first etch stop layer may be etched to expose portions of the semiconductor substrate 100 corresponding to the second active pattern.

Impurities may be implanted into the second active pattern 120b using the first silicide blocking layer pattern 150 as an ion implantation mask to form a second preliminary impurity region 153b at an upper portion of the second active pattern 120b.

Figure 8B:
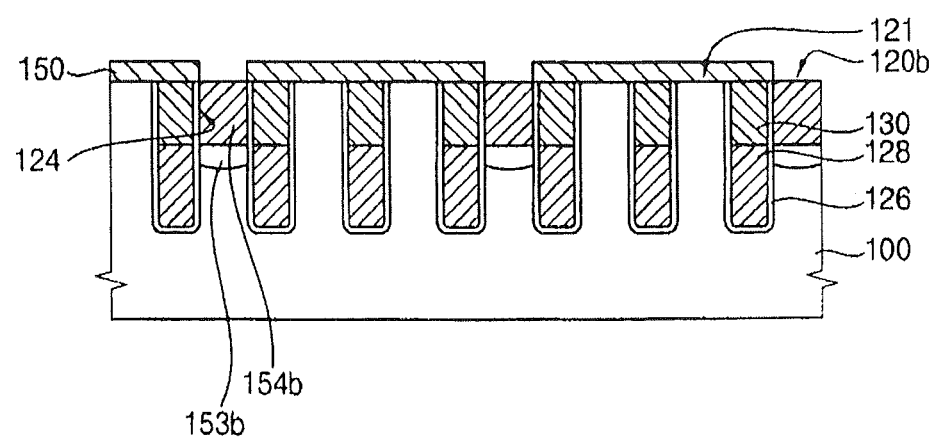

Referring to FIG. 8B, a first metal layer (not shown) may be formed on the second active pattern 120b and the first silicide blocking layer pattern 150.

Metal in the first metal layer and silicon in the semiconductor substrate 100 may be reacted with each other by a thermal treatment to form a second metal silicide pattern 154b in the second active pattern 120b. In example embodiments, the first metal layer on the first silicide blocking layer pattern 150 may not be reacted with silicon. The non-reacted first metal layer and the first silicide blocking layer pattern 150 may then be removed.

In example embodiments, the second metal silicide pattern 154b may be reacted with the second preliminary impurity region 152b. Thus, the second preliminary impurity region 152b may be converted into the second impurity region 153b.

In example embodiments, the second metal silicide pattern 154b may have a lower surface lower than a metallurgical junction of the second preliminary impurity region 152b. That is, the lower surface of the second metal silicide pattern 154b may make contact with the upper surface of the second impurity region 153b.

Figure 8C:
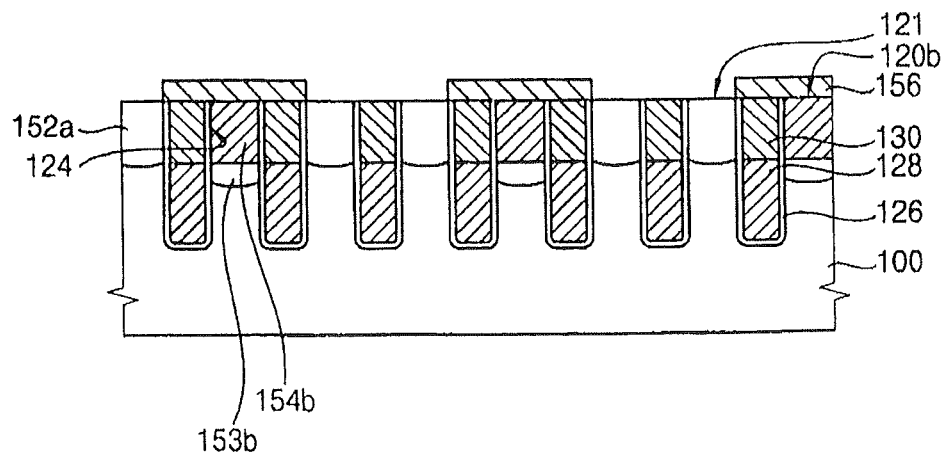

Referring to FIG. 8C, a second etch stop layer (not shown) may be formed on the upper surface of the semiconductor substrate 100. A second silicide blocking layer (not shown) may be formed on the second etch stop layer. The second silicide blocking layer may be etched until the second etch stop layer may be exposed to form a second silicide blocking layer pattern 156. Exposed portions of the second etch stop layer may be etched to expose portions of the semiconductor substrate 100 corresponding to the first active pattern.

Impurities may be implanted into the first active pattern 121 using the second silicide blocking layer pattern 156 as an ion implantation mask to form a first preliminary impurity region 152a at an upper portion of the first active pattern 121. The selection transistor may have a desired channel length by controlling the lower surface of the first preliminary impurity region 152a.

Figure 8D:
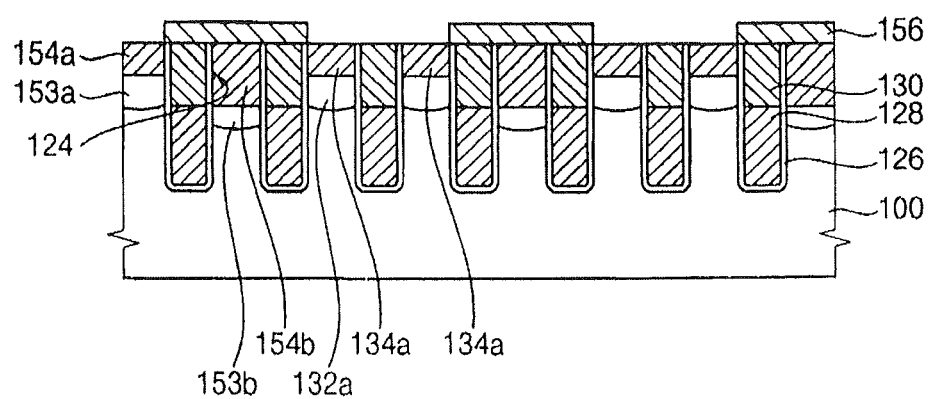

Referring to FIG. 8D, a second metal layer (not shown) may be formed on the semiconductor substrate 100 having the second silicide blocking layer pattern 156.

Metal in the second metal layer and silicon in the semiconductor substrate 100 may be reacted with each other by a thermal treatment to form a first metal silicide pattern 154a in the first active pattern 121. A non-reacted portion of the first metal layer and the second silicide blocking layer pattern 156 may then be removed.

In example embodiments, the first metal silicide pattern 154a may be reacted with the first preliminary impurity region 152a. Thus, the first preliminary impurity region 152a may be converted into the first impurity region 153a.

In example embodiments, the first metal silicide pattern 154a may have a lower surface lower than a metallurgical junction of the first preliminary impurity region 152a. That is, the lower surface of the first metal silicide pattern 154a may make contact with the upper surface of the first impurity region 153a.

Processes substantially the same as those illustrated with reference to FIG. 5M may be performed to complete the resistive memory device in FIGS. 6 and 7.

According to this example embodiment, the active pattern of the resistive memory device manufactured by the above-mentioned processes may not lean. Further, the source line of the resistive memory device may have a low resistance.

Figure 9:
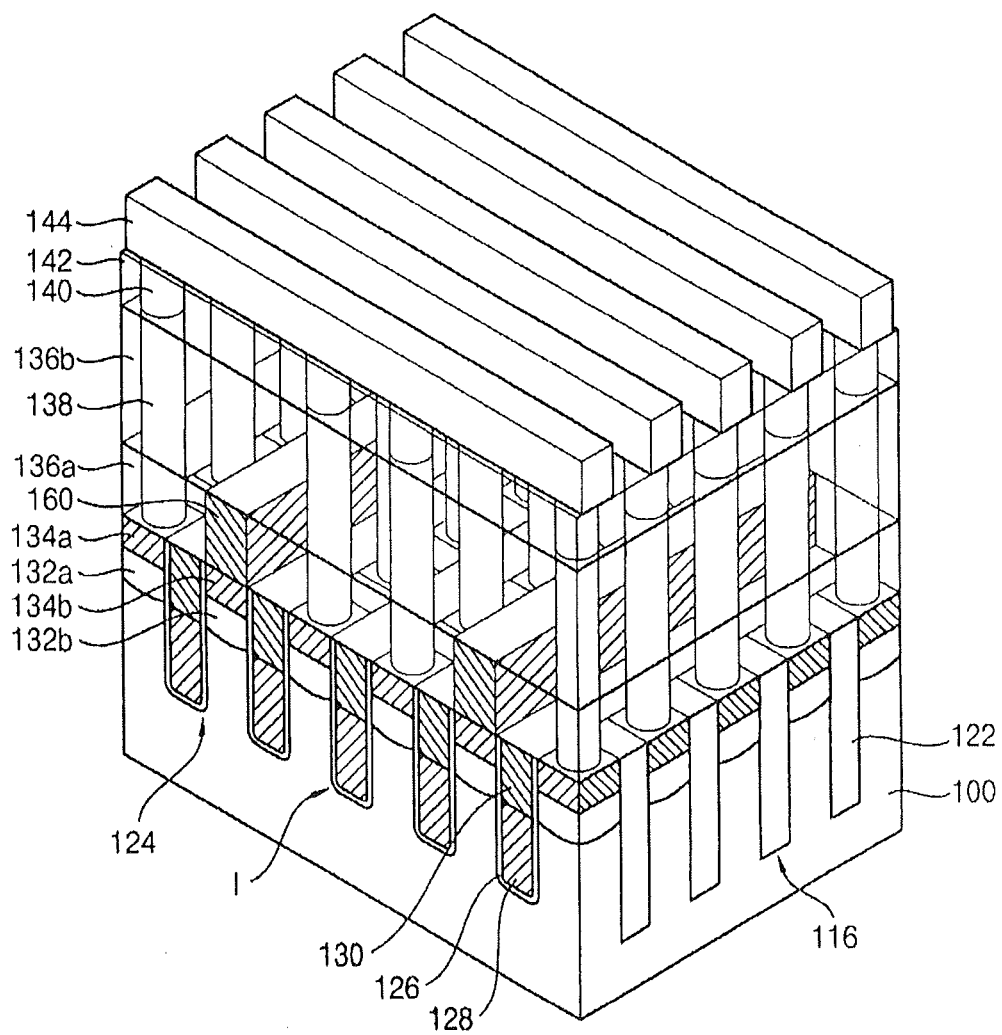
Figure 10:
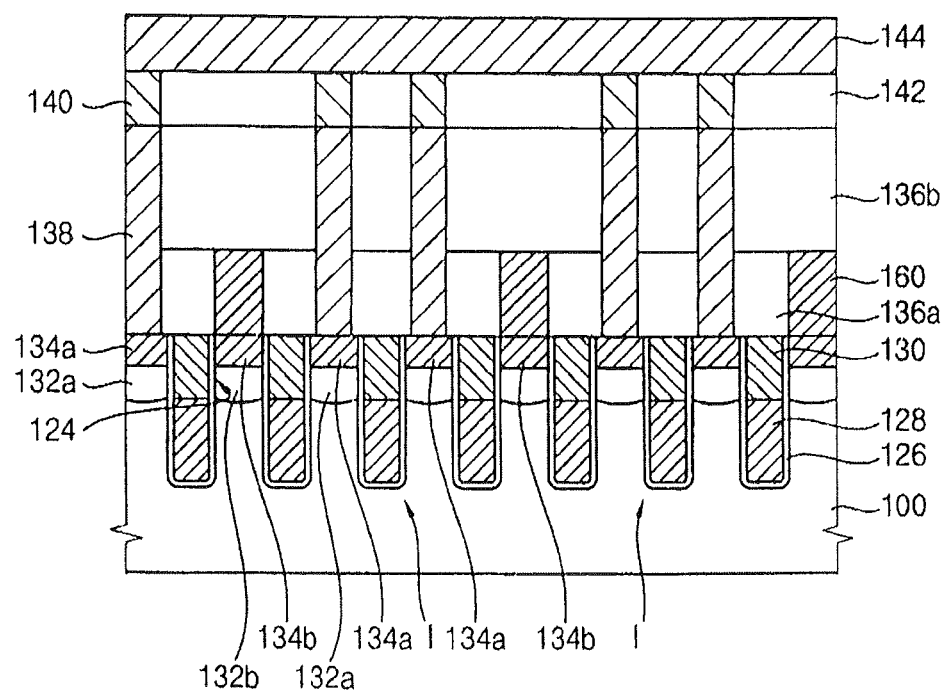

FIG. 9 is a perspective view illustrating a resistive memory device in accordance with example embodiments, and FIG. 10 is a cross-sectional view illustrating the resistive memory device in FIG. 9.

The resistive memory device in FIGS. 9 and 10 may include elements substantially the same as those of the resistive memory device in FIG. 1 except for a source line including a metal silicide pattern and a conductive pattern sequentially stacked. Thus, the same reference numerals may refer to the same elements and any further illustrations with respect to the same elements may be omitted herein for brevity.

Referring to FIGS. 9 and 10, the semiconductor substrate 100 may have the isolation trenches 116 and the recesses 124. The trenches 116 and the recesses 124 may have shapes substantially the same as those of the trenches 116 and the recesses in FIG. 1, respectively. Thus, the active pattern protruded from the semiconductor substrate 100 may have the isolated first active pattern 121 and the linear second active pattern 120b.

The gate electrode structures of the buried transistor may be formed in the recesses 124. The gate electrode structure may have a linear shape extended in the first direction. The gate electrode structure may have a structure substantially the same as that of the gate electrode structure in FIGS. 1 to 3.

In example embodiments, a first linear region and a second linear region may be defined between the recesses 124. The first active patterns 121 and the isolation patterns 122 may be positioned in the first linear region. Only the second active patterns 120b may be arranged in the second linear region. The isolation patterns 122 may be formed in the isolation trenches 116.

The first active pattern 121 and the second active pattern 120b may be formed at both sides of the gate electrode 128. A first impurity region 132a and a second impurity region 132b serving as a source region and a drain region may be formed in upper portions of the first active pattern 121 and the second active pattern 120b. That is, the first impurity region 153a may be formed in the first active pattern 121. The second impurity region 153b may be formed in the second active region 120b.

A first metal silicide pattern 134a may be provided on the first active pattern 121. A second metal silicide pattern 134b may be provided on the second active pattern 120b.

In example embodiments, the second metal silicide pattern 134b may have a linear shape extended in the first direction. The second metal silicide pattern 134b may serve as a source line S/L to which a bias may be applied. The second metal silicide pattern 134b may have a lower surface making contact with the second impurity region 132b.

A conductive pattern 160 may be formed on the second metal silicide pattern 134b. In example embodiments, the conductive pattern 160 may include a metal having a low resistance. The conductive pattern 160 may have a linear shape extended in the first direction. The conductive pattern 160 may serve as an upper source line. The source line may have a low resistance by forming the conductive pattern 160 on the second metal silicide pattern 134b.

A first insulating interlayer 136a and a second insulating interlayer 136b may be formed on the upper surface of the semiconductor substrate 100 to cover the first metal silicide pattern 134a, the second metal silicide pattern 134b and the conductive pattern 160. In example embodiments, the first insulating interlayer 136a may be arranged between the conductive patterns 160. The second insulating interlayer 136b may be formed on the first insulating interlayer 136a.

A contact plug 138 may be formed through the first insulating interlayer 136a and the second insulating interlayer 136b. The contact plug 138 may make contact with the first metal silicide pattern 134a.

A resistive structure 140 may be formed on the contact plug 138. An upper insulating interlayer 142 may be formed between the resistive structures 140. A bit line 144 may electrically make contact with the resistive structures 140. The bit line 144 may directly make contact with the resistive structure 140.

Figure 11A:
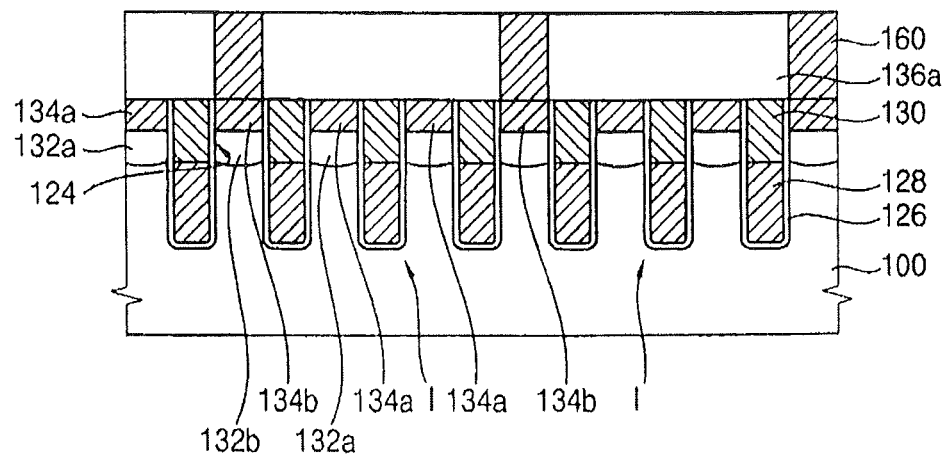
FIGS. 11A and 11B are cross-sectional views illustrating a method of manufacturing the resistive memory device in FIGS. 9 and 10.
Figure 11B:
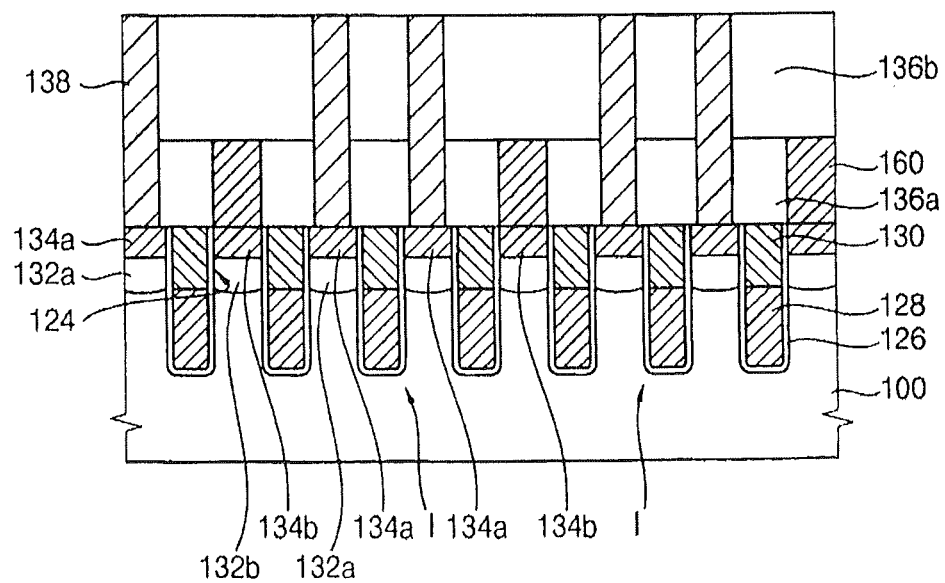

FIGS. 11A and 11B are cross-sectional views illustrating a method of manufacturing the resistive memory device in FIGS. 9 and 10.

Processes substantially the same as those illustrated with reference to FIGS. 5A to 5J may be performed to form a buried transistor on the semiconductor substrate 100 having the active region and the field region, a first metal silicide pattern 134a on the first active pattern 121, and the second metal silicide pattern 134b on the second active pattern 120b.

Referring to FIG. 11A, the first insulating interlayer 136a may be formed on the upper surface of the semiconductor substrate 100 to cover the first metal silicide pattern 134a and the second metal silicide pattern 134b.

The first insulating interlayer 136a may be etched to form a trench configured to expose the second metal silicide pattern 134b. The trench may be filled with a conductive layer. The conductive layer may be planarized to form the conductive pattern 160 making contact with the second metal silicide pattern 134b.

Alternatively, the conductive pattern 160 may be formed by forming a conductive layer, and patterning the conductive layer.

Referring to FIG. 11B, the second insulating interlayer 136b may be formed on the first insulating interlayer 136a. Contact holes may be formed through the second insulating interlayer 136 and the first insulating interlayer 136a to expose the first metal silicide pattern 134a. Contact plugs 138 may be formed in the contact holes.

Processes substantially the same as those illustrated with reference to FIG. 5M may be performed to form the resistive structure, the upper insulating interlayer and the bit line, thereby completing the resistive memory device in FIGS. 9 and 10.

According to this example embodiment, the active pattern of the resistive memory device manufactured by the above-mentioned processes may not lean. Further, the source line of the resistive memory device may have a low resistance.

Figure 12:
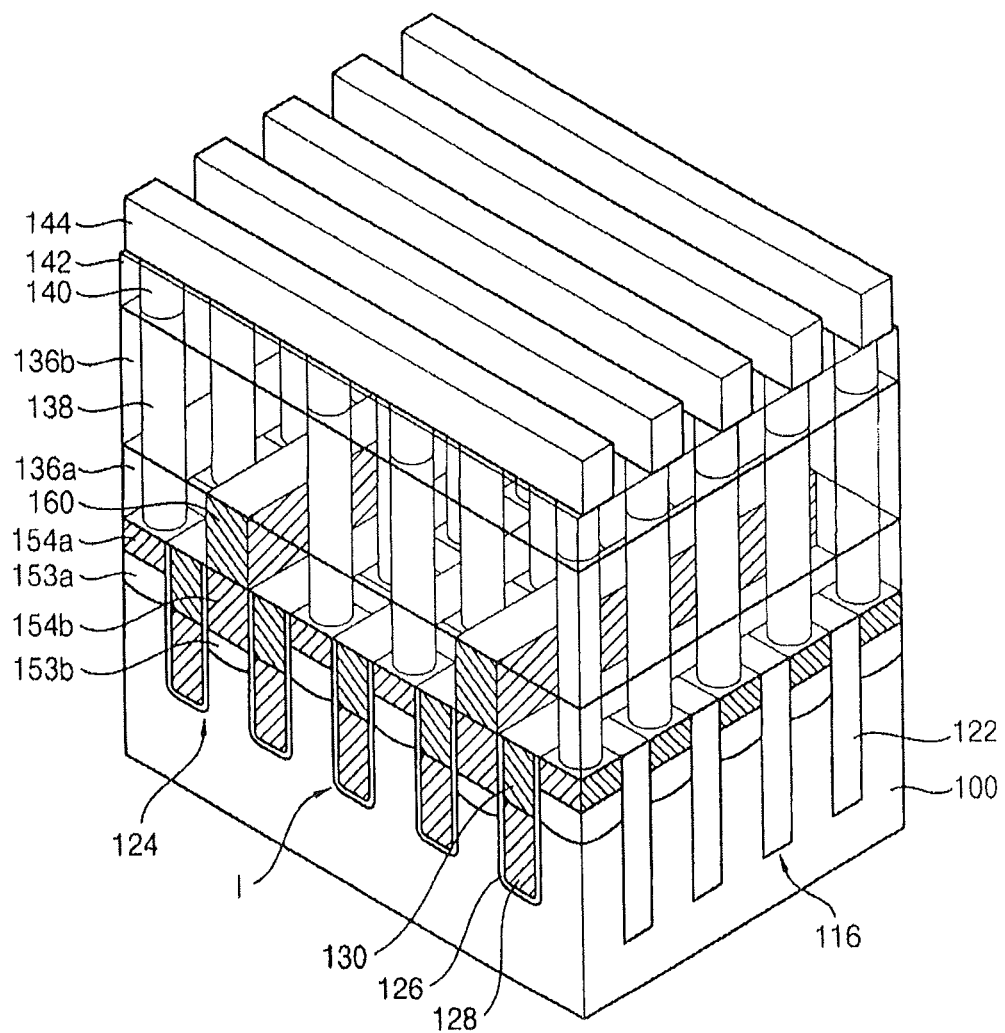

FIG. 12 is a perspective view illustrating a resistive memory device in accordance with example embodiments.

The resistive memory device in FIG. 12 may include elements substantially the same as those of the resistive memory device in FIG. 6 except for a bit line including a metal silicide pattern and a conductive pattern sequentially stacked. Thus, the same reference numerals may refer to the same elements and any further illustrations with respect to the same elements may be omitted herein for brevity.

Referring to FIG. 12, a buried transistor including a first impurity region 153a and a second impurity region 153b arranged asymmetrically may be formed on the semiconductor substrate 100 having the active region and the field region. A first metal silicide pattern 154a having a first thickness may be formed on the first impurity region 153a. A second metal silicide pattern 154b having a second thickness greater than the first thickness may be formed on the second impurity region 153b. The second metal silicide pattern 154b may serve as a lower source line.

A first insulating interlayer 136a may be formed on the semiconductor substrate 100 to cover the first metal silicide pattern 154a, the second metal silicide pattern 154b and the gate electrode structure.

A conductive pattern 160 may be formed through the first insulating interlayer 136a. The conductive pattern 160 may make contact with the second metal silicide pattern 154b. In example embodiments, the conductive pattern 160 may serve as an upper source line.

A second insulating interlayer 136b may be formed on the first insulating interlayer 136a to cover the conductive pattern 160. A contact plug 138 may be formed through the first insulating interlayer 136a and the second insulating interlayer 136b. The contact plug 138 may make contact with the first metal silicide pattern 154a.

A resistive structure 140 may be, formed on the contact plug 138. An upper insulating interlayer 142 may be formed between the resistive structures 140. A bit line 144 may electrically make contact with the resistive structures 140. The bit line 144 may directly make contact with the resistive structure 140.

A method of manufacturing the resistive memory device in FIG. 12 may include processes substantially the same as those illustrated with reference to FIGS. 8A to 8D except for further including a process for forming the conductive pattern 160 on the second metal silicide pattern 154b.

In example embodiments, processes substantially the same as those illustrated with reference to FIGS. 8A to 8D may be performed to form the buried transistor including the first impurity region 153a and the second impurity region 153b arranged asymmetrically, the first metal silicide pattern 154a having a first thickness, and the second metal silicide pattern 154b having a second thickness greater than the first thickness may be formed on the second impurity region 153b.

The first insulating interlayer 136a may be formed on the semiconductor substrate 100 to cover the first metal silicide pattern 154a, the second metal silicide pattern 154b and the gate electrode structure.

The first insulating interlayer 136a may be etched to form a trench configured to expose the second metal silicide pattern 134b. The trench may be filled with a conductive layer. The conductive layer may then be planarized to form the conductive pattern 160 making contact with the second metal silicide pattern 134b.

Alternatively, the conductive pattern 160 may be formed by forming a conductive layer, and patterning the conductive layer.

A second insulating interlayer 136b may be formed on the first insulating interlayer 136a. Contact holes may be formed through the second insulating interlayer 136b and the first insulating interlayer 136a to expose the first metal silicide pattern 134a. A contact plug 138 may be formed in the contact holes.

A resistive structure 140 may be formed on the contact plug 138. An upper insulating interlayer 142 may be formed between the resistive structures 140. A bit line 144 may electrically make contact with the resistive structures 140 to complete the resistive memory device in FIG. 12. The bit line 144 may directly make contact with the resistive structure 140.

According to this example embodiment, the active pattern of the resistive memory device manufactured by the above-mentioned processes may not lean. Further, the source line of the resistive memory device may have a low resistance.

Figure 13:
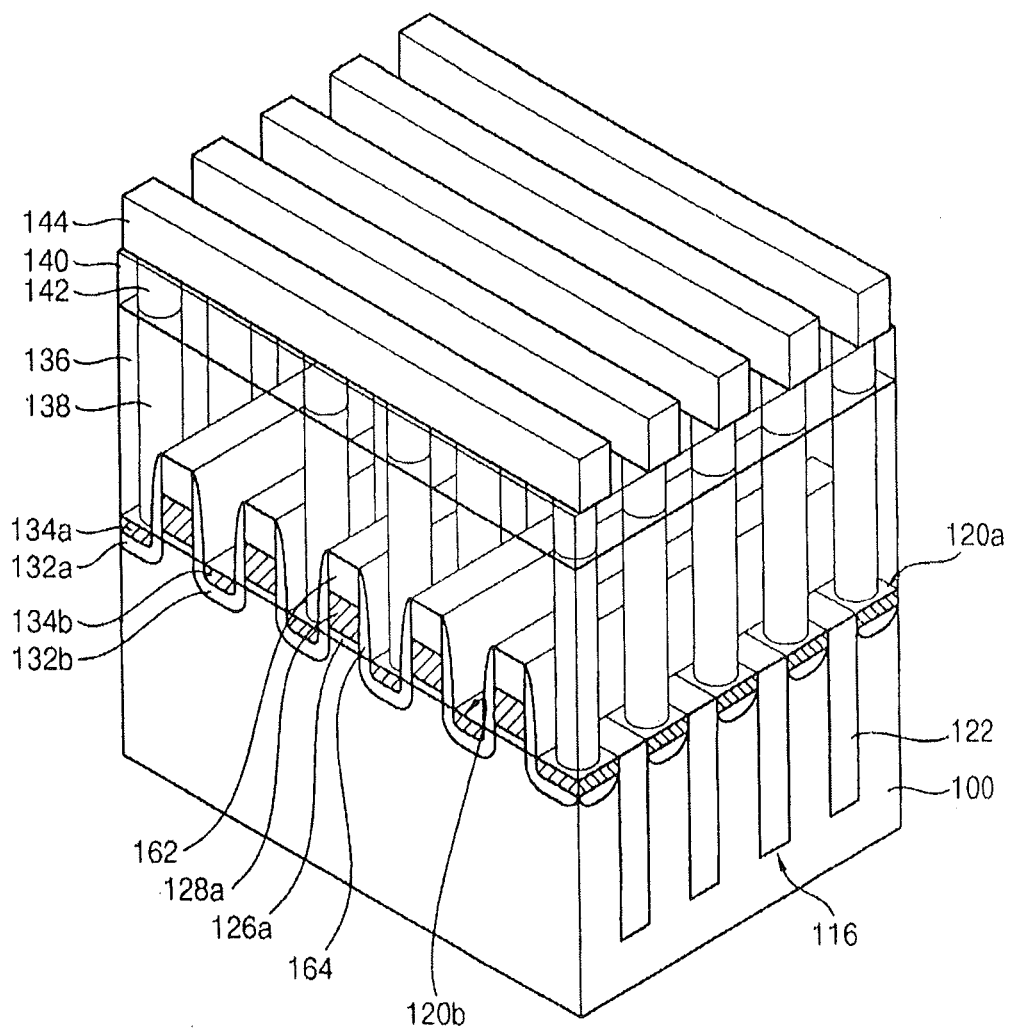
Figure 14:
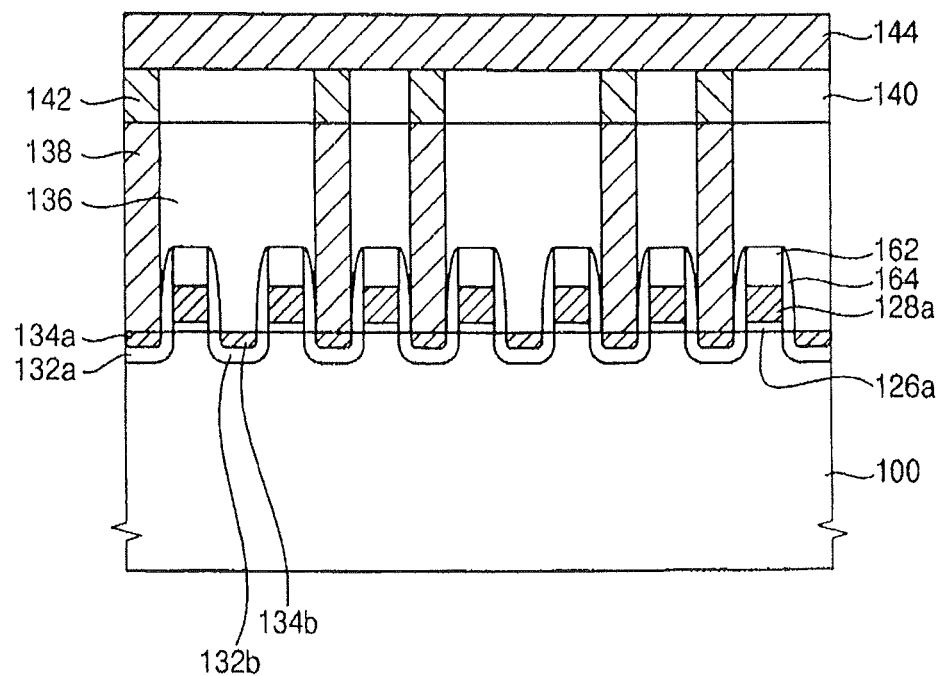

FIG. 13 is a perspective view illustrating a resistive memory device in accordance with example embodiments, and FIG. 14 is a cross-sectional view illustrating the resistive memory device in FIG. 13.

The resistive memory device in FIGS. 13 and 14 may include elements substantially the same as those of the resistive memory device in FIG. 1 except for a planar transistor. Thus, the same reference numerals may refer to the same elements and any further illustrations with respect to the same elements may be omitted herein for brevity.

Referring to FIGS. 13 and 14, a semiconductor substrate 100 may have isolation trenches 116. In example embodiments, regions of the semiconductor substrate 100 where the isolation trenches 116 may not be formed may be referred to as an active pattern. The active pattern may include a first active pattern 120a extended in the second direction, and a second active pattern 120b extended in the first direction. Thus, the first active pattern 120a and the second active pattern 120b may be intersected with each other.

In example embodiments, the first active pattern 120a and the second active pattern 120b may have a structure substantially the same as that in FIG. 4. Further, the semiconductor substrate 100 including the first active pattern 120a and the second active pattern 120b may not have recesses.

The first active patterns 120a may serve as pads electrically connected to bit lines to form unit cells. Isolation patterns 122 may be arranged between the first active patterns 120a in the first direction. The isolation patterns 122 may be formed in the isolation trenches 116.

In example embodiments, the second active patterns 120b may have linear shapes extended in the first direction. Thus, the second active patterns 120b may have a shape without cut portions by the isolation patterns 122.

Gate electrode structures may be formed on the semiconductor substrate. The gate electrode structures may cross the first active patterns 120b. The gate electrode structures may be extended in the first direction. The gate electrode structures may serve as a gate of the planar transistor. Each of the gate electrode structures may include a gate insulating layer 126a, a gate electrode 128a and a hard mask pattern 162 sequentially stacked. A spacer 164 may be formed on a sidewall of the gate electrode structure.

The three gate electrode structures may be extended in parallel with each other on the first active patterns 120a between the linear second active patterns 120b. Edge-located gate electrode structures among the three gate electrode structures may serve as a cell selection transistor. A central gate electrode structure among the three gate electrode structures may serve as an isolation transistor for electrically isolating the cell selection transistors from each other. Each of the edge-located gate electrode structures may make contact with the second active patterns 120b.

A first impurity region 132a and a second impurity region 132b may be formed in the first active pattern 120a and the second active pattern 120b at both sides of the gate electrode structure, respectively. The first impurity region 132a and the second impurity region 132b may serve as a source region and a drain region. In example embodiments, the first impurity region 132a may have an isolated shape. The second impurity region 132b may have a linear shape extended in the second direction.

A first metal silicide pattern 134a and a second metal silicide pattern 134b may be formed on the first impurity region 132a and the second impurity region 132b, respectively. The second metal silicide pattern 134b may have a linear shape extended in the second direction. The second metal silicide pattern 134b may serve as an upper source line.

An insulating interlayer 136 may be formed on the semiconductor substrate 100 to cover the first metal silicide pattern 134a, the second metal silicide pattern 134b and the gate electrode structure. A contact plug 138 may be formed through the insulating interlayer 136. The contact plug 138 may make contact with the first metal silicide pattern 134a.

A resistive structure 140 may be formed on the contact plug 138. An upper insulating interlayer 142 may be formed between the resistive structures 140. A bit line 144 may electrically make contact with the resistive structures 140. The bit line 144 may directly make contact with the resistive structure 140.

Figure 15A:
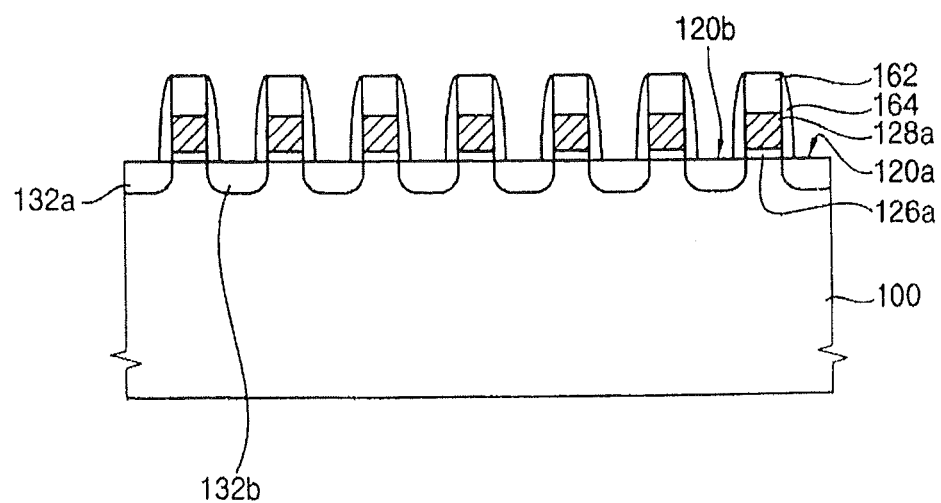
FIGS. 15A and 15B are cross-sectional views illustrating a method of manufacturing the resistive memory device in FIGS. 13 and 14.
Figure 15B:
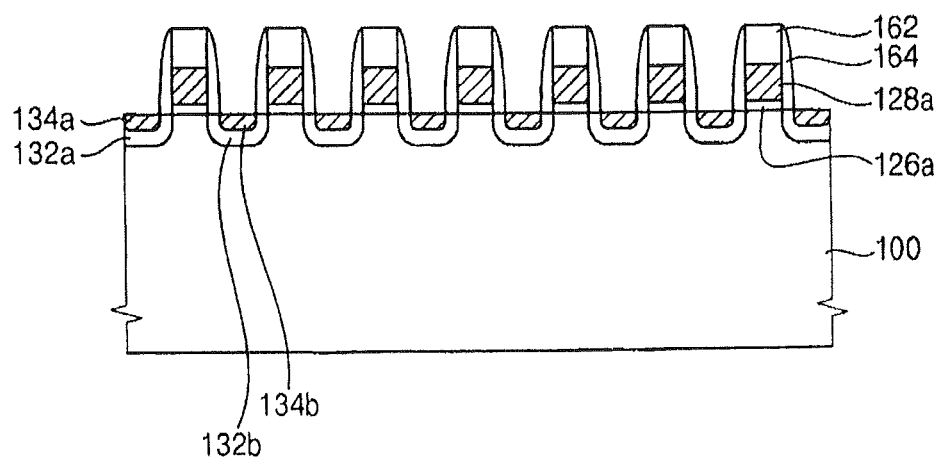

FIGS. 15A and 15B are cross-sectional views illustrating a method of manufacturing the resistive memory device in FIGS. 13 and 14.

Processes substantially the same as those illustrated with reference to FIGS. 5A to 5H may be performed to form the isolation trenches 116 in the semiconductor substrate 100. The isolation patterns 122 may be formed in the isolation trenches 116. Further, the first active pattern 120a and the second active pattern 120b may be formed by the above-mentioned processes. The first active patterns 120a may have a linear shape extend in the second direction. The second active patterns 120b may have linear shapes extended in the first direction.

Referring to FIG. 15A, a gate insulating layer, a gate electrode layer and a hard mask layer may be sequentially formed on the semiconductor substrate 100 having the first active pattern 120a and the second active pattern 120b. The hard mask layer may be patterned to form a hard mask pattern 162. The gate electrode layer may be etched using the hard mask pattern 162 as an etch mask to form the gate electrode structure including the gate insulating layer 126a, the gate electrode 128a and the hard mask pattern 162 sequentially stacked. In example embodiments, the gate electrode structure may have a linear shape extended in the first direction to cross the first active pattern 120a.

A spacer layer may be formed on the semiconductor substrate 100 and the gate electrode structure. The spacer layer may be anisotropically etched to form the spacer on the sidewall of the gate electrode structure.

Impurities may be implanted into the first active pattern 120a and the second active pattern 120b at both sides of the gate electrode structure to form the first impurity region 132a and the second impurity region 132b.

Referring to FIG. 15B, a metal layer may be formed on the semiconductor substrate 100 including the gate electrode structure. Metal in the metal layer and silicon in the semiconductor substrate 100 may be reacted with each other to form the first metal silicide pattern 134a and the second metal silicide pattern 134b.

In example embodiments, the first metal silicide pattern 134a may have an isolated shape configured to make contact with the first impurity region 132a. The second metal silicide pattern 134b may have a linear shape extended in the first direction and configured to make contact with the second impurity region 132b. The second metal silicide pattern 134b may serve as a source line connected between source regions of cells in the selection transistor.

Processes substantially the same as those illustrated with reference to FIG. 5M may be performed to complete the resistive memory device in FIGS. 13 and 14.

According to this example embodiment, the active pattern of the resistive memory device manufactured by the above-mentioned processes may not lean. Further, the source line of the resistive memory device may have a low resistance.

Figure 16:
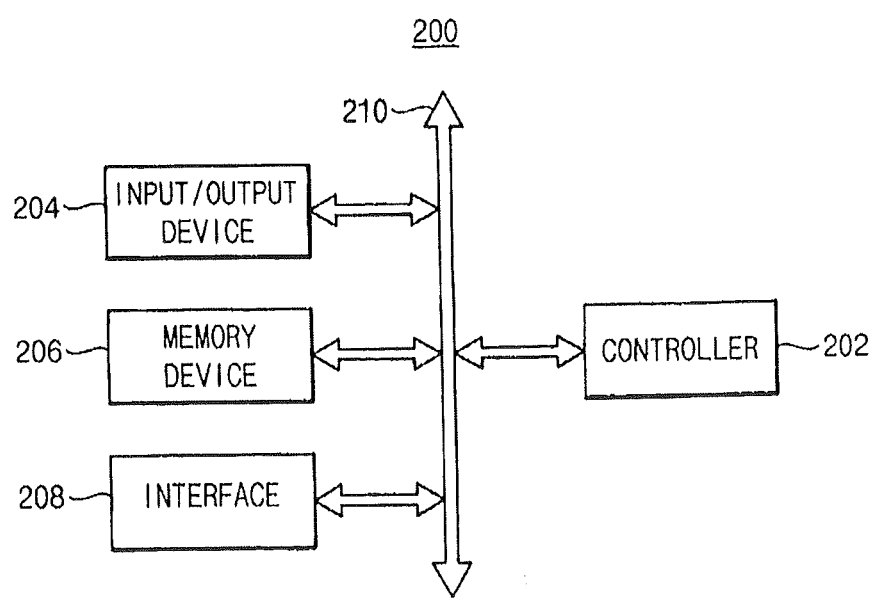

FIG. 16 is a block diagram illustrating an electronic system including any one of the memory devices, such as resistive memory devices in accordance with example embodiments.

Referring to FIG. 16, an electronic system 200 of this example embodiment may include a controller 202, an input/output device 204, a memory device 206, an interface 208 and a bus 210. The controller 202, the input/output device 204, the memory device 206 and/or the interface 208 may be coupled with each other via the bus 210. The bus 210 may serve as a path through which data may be transmitted.

In example embodiments, the controller 202 may include a microprocessor, a digital signal processor, a microcontroller and/or logic devices having functions substantially similar to the microprocessor, the digital signal processor and the microcontroller. The input/output device 204 may include a keypad, a keyboard and/or a display unit, etc. The memory device 206 may store the data and/or commands. The memory device 206 may include any one of the semiconductor devices in above-mentioned example embodiments. Additionally, the memory device 206 may further include other semiconductor devices such as a flash memory device, a DRAM device and/or an SRAM device, etc. The interface 208 may transmit the data to a communication network. The interface 208 may receive the data from the communication network. The interface 208 may have a wired structure or a wireless structure. For example, the interface 208 may include an antenna, a wired or wireless transceiver, etc. The electronic system 200 may further include operational memory device for improving operations of the controller 202 such as a DRAM device and/or an SRAM device, etc., having a high operational speed.

In example embodiments, the electronic system 200 may be applied to electronic articles such as a personal digital assistant (PDA), a portable computer, a web tablet, a wireless phone, a mobile phone, a digital music player and/or a memory card, etc.

According to example embodiments, the highly integrated resistive memory device may include the source line having a low resistance with a low process failure. The resistive memory device may be applied to various electronic articles, communication articles, memory systems, etc.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A resistive memory device comprising:
   a substrate having a first region where isolation patterns and first active patterns are alternately arranged in a first direction, and a second region where linear second active patterns are extended in the first direction;
   gate electrode structures arranged between the first region and the second region of the substrate, the gate electrode structures having a linear shape extended in the first direction;
   first and second impurity regions in the first and second active patterns at both sides of each of the gate electrode structures;
   a first metal silicide pattern having an isolated shape that is configured to contact an upper surface of the first impurity region;
   a second metal silicide pattern configured to contact an upper surface of the second impurity region and extended in the first direction;
   a bit line contact on the first metal silicide pattern;
   a resistive structure connected to the bit line contact; and
   a bit line connected to the resistive structure.

2. The resistive memory device of claim 1, wherein the substrate has recesses, and the gate electrode structures are formed in the recesses.

3. The resistive memory device of claim 1, wherein the gate electrode structures are three in number linearly extended in the first direction between the second active patterns.

4. The resistive memory device of claim 1, wherein gate electrode structures among the gate electrode structures adjacent to the second active patterns serve as a gate electrode of a cell selection transistor, and a central gate electrode structure among the gate electrode structures serves as a gate electrode of an isolated transistor.

5. The resistive memory device of claim 1, wherein the second metal silicide pattern corresponds to a source line connected to a source region of a transistor.

6. The resistive memory device of claim 1, further comprising a conductive pattern on the second metal silicide pattern.

7. The resistive memory device of claim 1, wherein the first metal silicide pattern has a thickness substantially the same as that of the second metal silicide pattern.

8. The resistive memory device of claim 1, wherein the second impurity region has a lower surface lower than that of the first impurity region.

9. The resistive memory device of claim 1, wherein the second metal silicide pattern has a thickness greater than that of the first metal silicide pattern.

10. A semiconductor device comprising:
a semiconductor substrate including an array of semiconductor posts protruding therefrom in a direction that is perpendicular to a face of the semiconductor substrate, a respective post including a pair of first opposing semiconductor sidewalls and a pair of second opposing semiconductor sidewalls, wherein the pair of first opposing semiconductor sidewalls is longer than the pair of second opposing semiconductor sidewalls, in the direction that is perpendicular to the face of the semiconductor substrate.

11. The semiconductor device of claim 10, further comprising an isolation pattern that extends between the first opposing semiconductor sidewalls of adjacent ones of the array of semiconductor posts.

12. The semiconductor device of claim 11, further comprising an electrode pattern that extends between the second opposing semiconductor sidewalls of adjacent ones of the array of semiconductor posts.

13. The semiconductor device of claim 12, further comprising an array of memory cells, a respective one of which is on, and electrically connected to, a respective one of the semiconductor posts.

14. The semiconductor device of claim 13, wherein the array of memory cells comprises an array of resistive memory cells.

15. The semiconductor device of claim 14, wherein the electrode pattern comprises an insulating layer on the second opposing semiconductor sidewalls of adjacent ones of the array of semiconductor posts and a gate electrode on the insulating layer.

* * * * *